US009698253B2

(12) United States Patent
Zhao

(10) Patent No.: US 9,698,253 B2
(45) Date of Patent: Jul. 4, 2017

(54) SEMICONDUCTOR FIN FABRICATION METHOD AND FIN FET DEVICE FABRICATION METHOD

(71) Applicant: Huawei Technologies Co., Ltd., Shenzhen, Guangdong (CN)

(72) Inventor: Jing Zhao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/836,663

(22) Filed: Aug. 26, 2015

(65) Prior Publication Data

US 2015/0372110 A1 Dec. 24, 2015

Related U.S. Application Data

(63) Continuation of application No. PCT/CN2014/071197, filed on Jan. 23, 2014.

(30) Foreign Application Priority Data

Jul. 17, 2013 (CN) .......................... 2013 1 0300403

(51) Int. Cl.
*H01L 21/336* (2006.01)
*H01L 21/20* (2006.01)
(Continued)

(52) U.S. Cl.
CPC .... *H01L 29/6681* (2013.01); *H01L 21/02636* (2013.01); *H01L 21/266* (2013.01);
(Continued)

(58) Field of Classification Search
CPC ....................................................... H01L 21/33
(Continued)

(56) References Cited

U.S. PATENT DOCUMENTS 5,824,600 A * 10/1998 Byun ................ H01L 21/28518
257/E21.165
6,211,042 B1 * 4/2001 McFeely ................. C30B 25/02
257/E21.102

(Continued)

FOREIGN PATENT DOCUMENTS

CN 102034714 A 4/2011
CN 102214579 A 10/2011

(Continued)

*Primary Examiner* — Yuanda Zhang
*Assistant Examiner* — Sheikh Maruf

(57) ABSTRACT

A semiconductor fin fabrication method includes: providing a substrate; selectively epitaxially growing a first mask layer in a predetermined zone on the substrate; selectively epitaxially growing a first epitaxial layer on the substrate by using the first mask layer as a mask; and removing the first mask layer and a part, under the first mask layer, of the substrate by using the first epitaxial layer as a mask and by using an anisotropic etching method, so as to form a fin under the first epitaxial layer. According to the foregoing solutions, a manner in which a selective epitaxial growth technology and an anisotropic etching technology are combined is used It can be ensured that a semiconductor fin and a surface of a gate oxidized layer are perpendicular to each other, roughness of a surface of the semiconductor fin is reduced, and a fin with a smooth side surface is formed.

11 Claims, 22 Drawing Sheets

(51) Int. Cl.
*H01L 21/36* (2006.01)
*H01L 21/311* (2006.01)
*H01L 29/66* (2006.01)
*H01L 21/02* (2006.01)
*H01L 21/266* (2006.01)
*H01L 21/308* (2006.01)

(52) U.S. Cl.
CPC ...... *H01L 21/3081* (2013.01); *H01L 21/3086* (2013.01); *H01L 21/31144* (2013.01); *H01L 29/6653* (2013.01); *H01L 29/66795* (2013.01)

(58) Field of Classification Search
USPC .............. 438/222, 157, 283, 481, 478, 703; 257/288, 347, 369, E21.421, E21.24, 257/E21.634, E21.09
See application file for complete search history.

(56) References Cited

U.S. PATENT DOCUMENTS

| | | | |
|---|---|---|---|
| 6,406,973 B1* | 6/2002 | Lee | H01L 29/1054 257/213 |
| 6,645,797 B1* | 11/2003 | Buynoski | H01L 29/785 438/157 |
| 7,897,468 B1* | 3/2011 | Luo | H01L 29/1083 438/283 |
| 2002/0015789 A1* | 2/2002 | Choi | C07F 15/065 427/255.28 |
| 2005/0173740 A1* | 8/2005 | Jin | H01L 29/785 257/288 |
| 2006/0105538 A1* | 5/2006 | Pyi | H01L 27/10814 438/396 |
| 2006/0121667 A1* | 6/2006 | Bae | H01L 21/8249 438/202 |
| 2007/0215929 A1* | 9/2007 | Yasuda | H01L 21/28273 257/347 |
| 2008/0191244 A1* | 8/2008 | Kim | H01L 21/823807 257/190 |
| 2009/0042348 A1* | 2/2009 | Yamamoto | H01L 21/823456 438/275 |
| 2009/0091002 A1* | 4/2009 | Arena | H01L 21/0237 257/623 |
| 2010/0240197 A1* | 9/2010 | Kim | H01L 21/823418 438/478 |
| 2010/0327329 A1* | 12/2010 | Itokawa | H01L 21/76232 257/255 |
| 2011/0006349 A1* | 1/2011 | Ota | H01L 21/26586 257/288 |
| 2011/0081764 A1* | 4/2011 | Maszara | H01L 29/785 438/413 |
| 2011/0248348 A1* | 10/2011 | Gan | H01L 29/66795 257/369 |
| 2013/0020640 A1* | 1/2013 | Chen | H01L 29/66795 257/347 |
| 2013/0168746 A1* | 7/2013 | Mieno | H01L 29/66795 257/288 |
| 2013/0234204 A1* | 9/2013 | Kang | H01L 29/7851 257/190 |
| 2014/0065775 A1* | 3/2014 | Chien | H01L 29/41791 438/197 |
| 2014/0117418 A1* | 5/2014 | Flachowsky | H01L 29/785 257/288 |
| 2014/0120678 A1* | 5/2014 | Shinriki | H01L 29/66795 438/283 |
| 2014/0191298 A1* | 7/2014 | Chen | H01L 29/401 257/288 |
| 2014/0203369 A1* | 7/2014 | Fumitake | H01L 29/785 257/365 |
| 2014/0327054 A1* | 11/2014 | Adam | H01L 29/6656 257/288 |
| 2015/0024561 A1* | 1/2015 | Li | H01L 21/28123 438/222 |
| 2015/0206970 A1* | 7/2015 | Lin | H01L 29/1054 257/77 |
| 2015/0340290 A1* | 11/2015 | Zhu | H01L 21/823821 257/401 |
| 2015/0372110 A1* | 12/2015 | Zhao | H01L 21/02636 438/283 |

FOREIGN PATENT DOCUMENTS

| | | |
|---|---|---|
| CN | 102222693 A | 10/2011 |
| CN | 102646599 A | 8/2012 |
| CN | 102891087 A | 1/2013 |
| CN | 103187290 A | 7/2013 |
| CN | 103413758 A | 11/2013 |

* cited by examiner

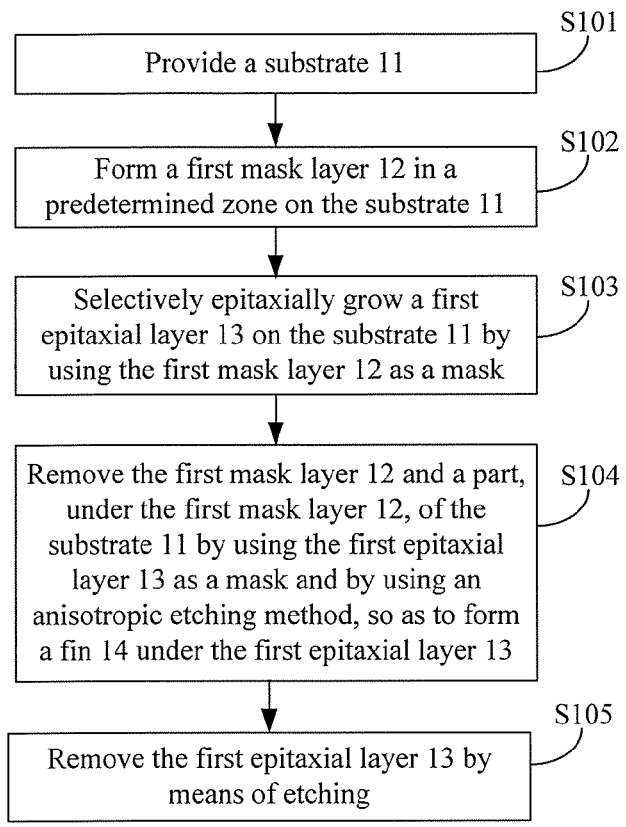
FIG. 1
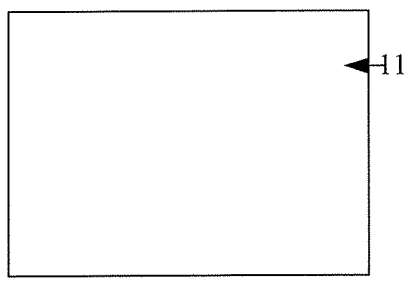
FIG. 2a (1)
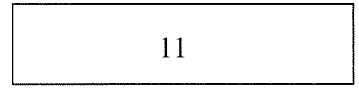
FIG. 2a (2)

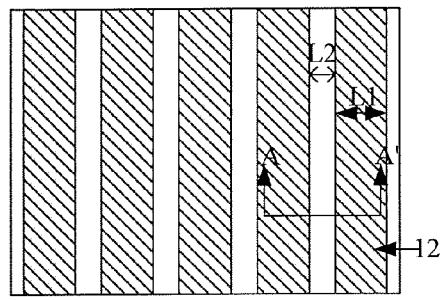
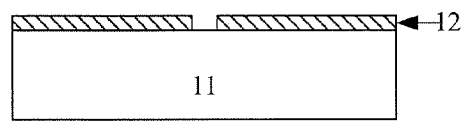
FIG. 2b (1)　　　　　　　　FIG. 2b (2)
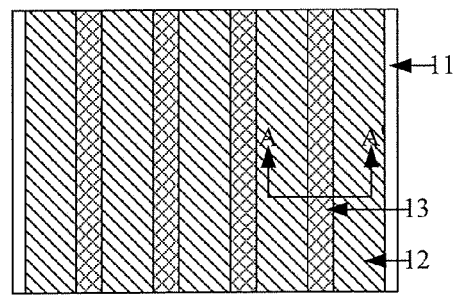
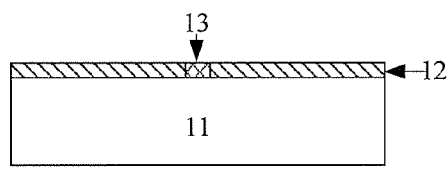
FIG. 2c (1)　　　　　　　　FIG. 2c (2)
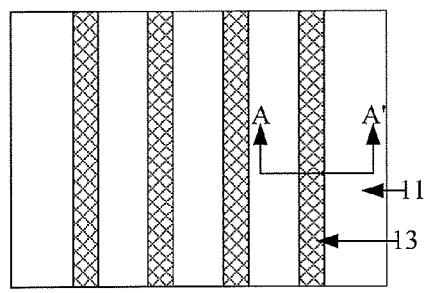
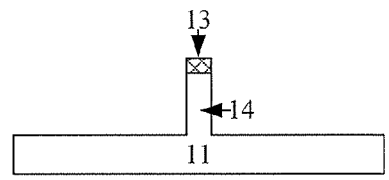
FIG. 2d (1)　　　　　　　　FIG. 2d (2)

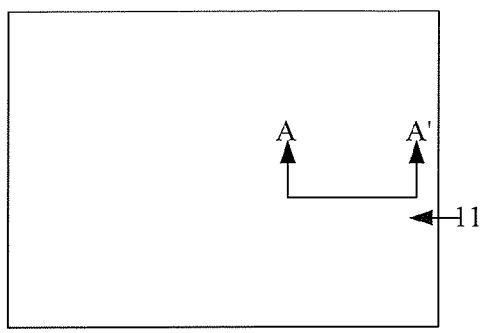
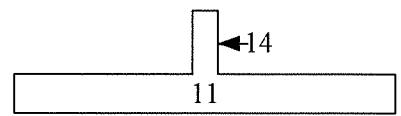
FIG. 2e (1)  FIG. 2e (2)

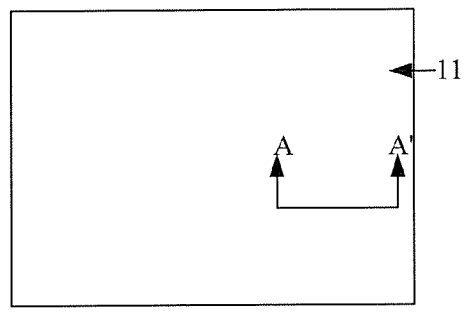 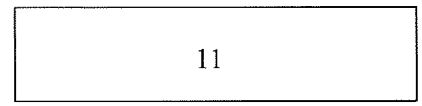
FIG. 6a (1)  　　　　　　　　FIG. 6a (2)
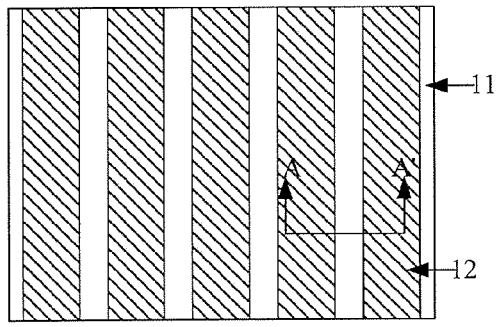 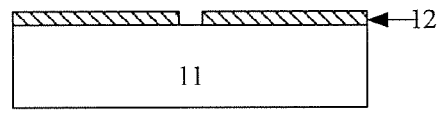
FIG. 6b (1)  　　　　　　　　FIG. 6b (2)
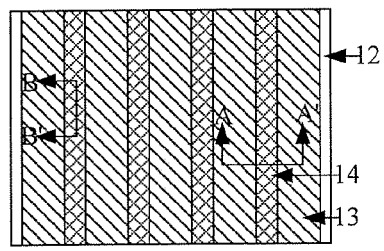 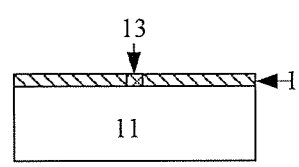 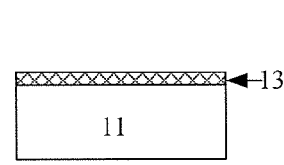
FIG. 6c (1)　　　FIG. 6c (2)　　　FIG. 6c (3)

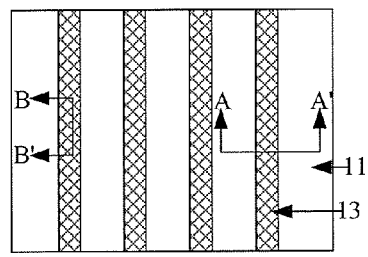 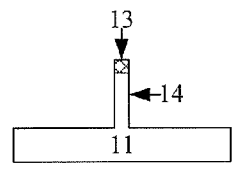 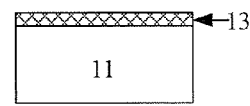
FIG. 6d (1)  FIG. 6d (2)  FIG. 6d (3)
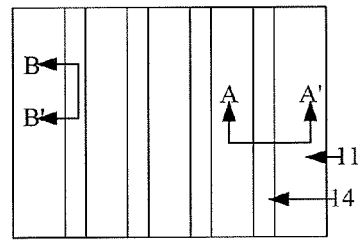 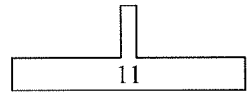 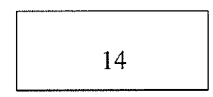
FIG. 6e (1)  FIG. 6e (2)  FIG. 6e (3)
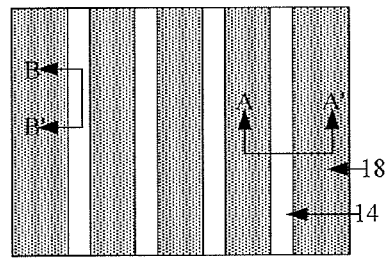 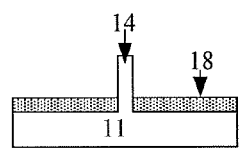 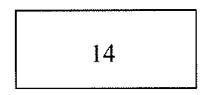
FIG. 6f (1)  FIG. 6f (2)  FIG. 6f (3)

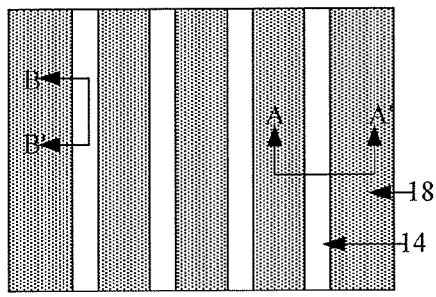 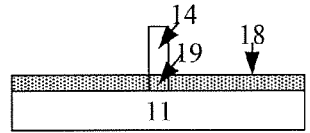 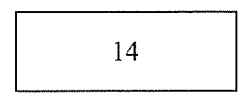
FIG. 6g (1)    FIG. 6g (2)    FIG. 6g (3)
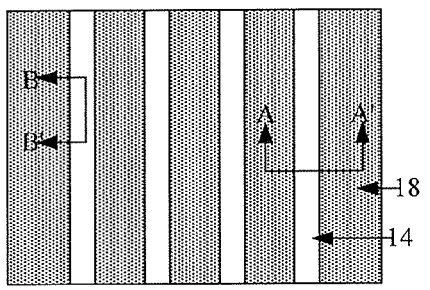 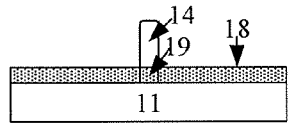 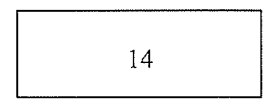
FIG. 6h (1)    FIG. 6h (2)    FIG. 6h (3)
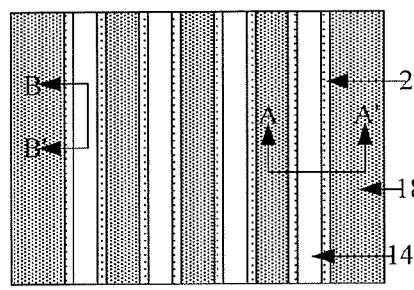 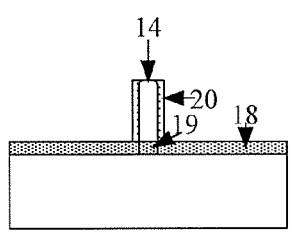 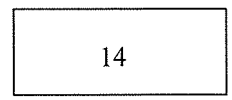
FIG. 6i (1)    FIG. 6i (2)    FIG. 6i (3)

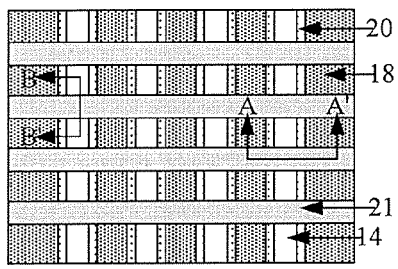 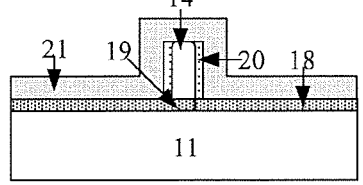 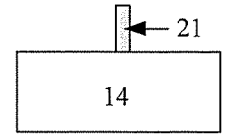
FIG. 6j (1)　　　　FIG. 6j (2)　　　　FIG. 6j (3)
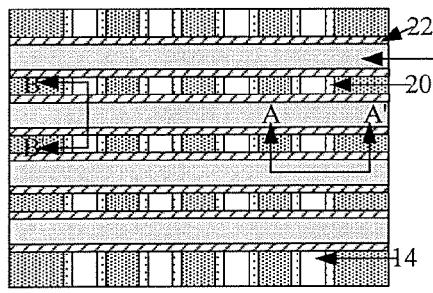 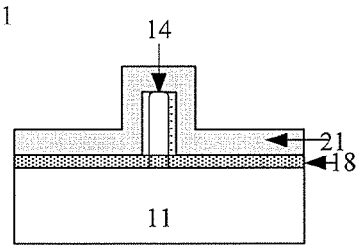 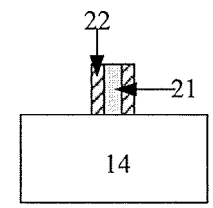
FIG. 6k (1)　　　　FIG. 6k (2)　　　　FIG. 6k (3)
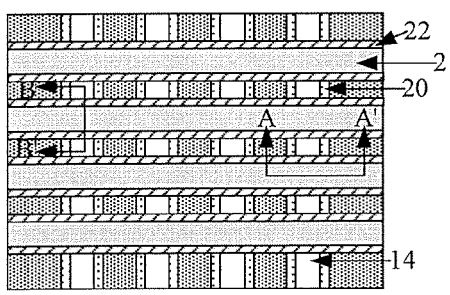 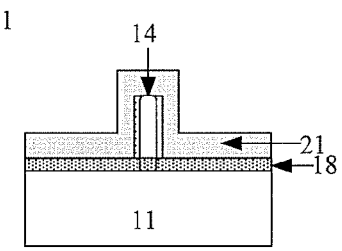 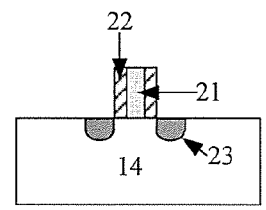
FIG. 6l (1)　　　　FIG. 6l (2)　　　　FIG. 6l (3)

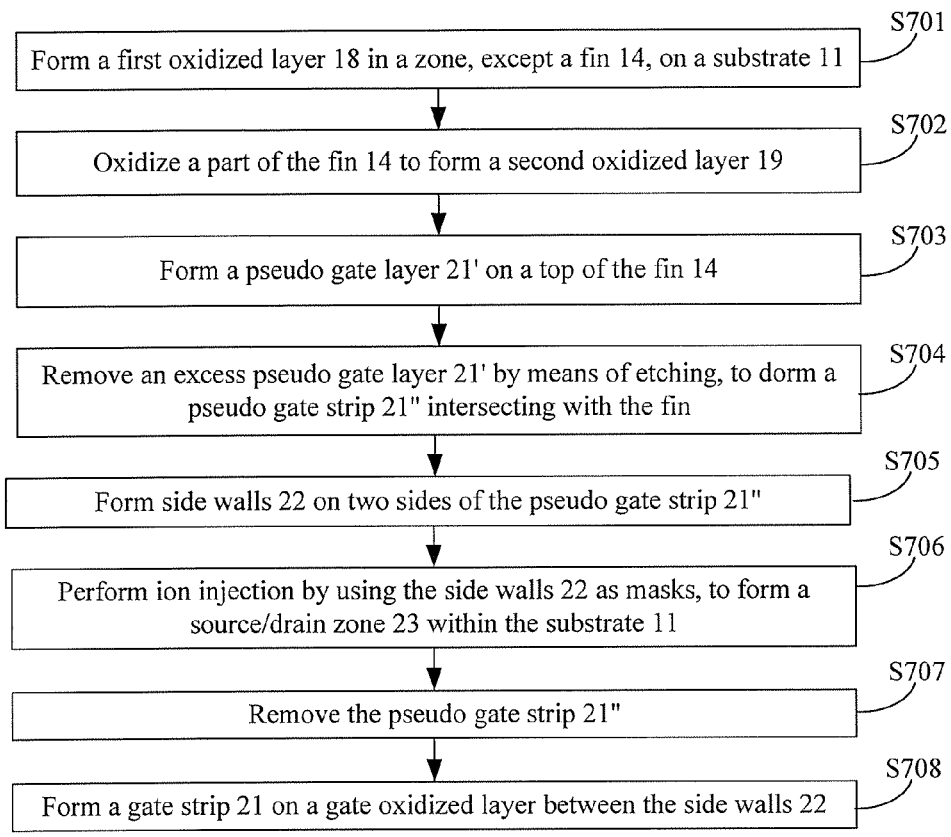
FIG. 7
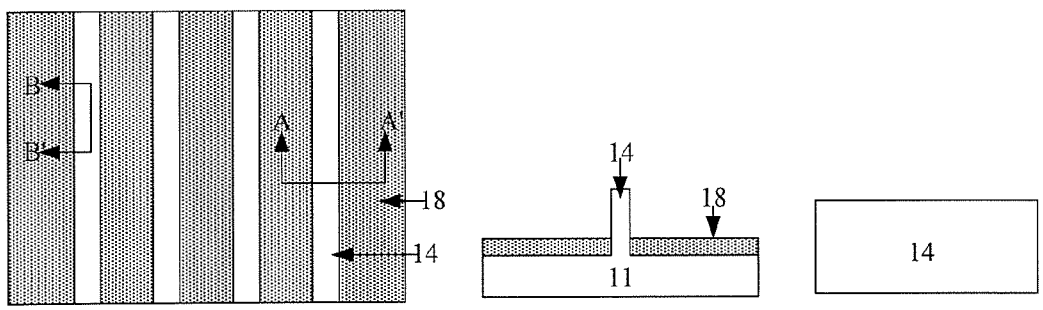
FIG. 8a (1)   FIG. 8a (2)   FIG. 8a (3)

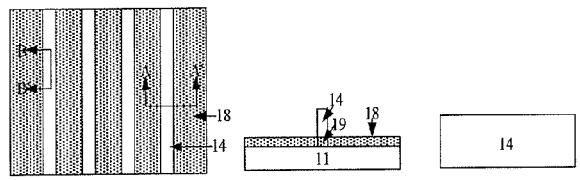
FIG. 8b (1)  FIG. 8b (2)  FIG. 8b (3)
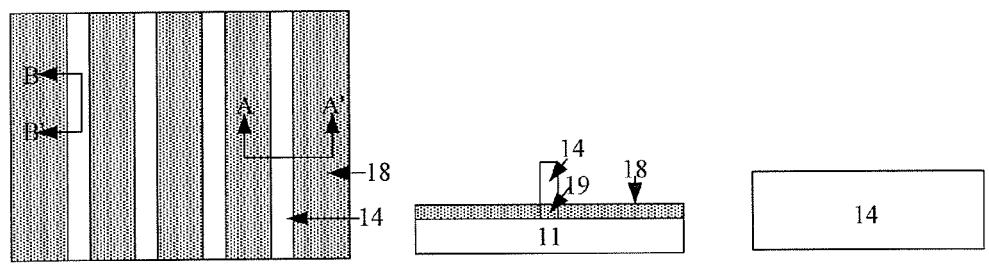
FIG. 8c (1)  FIG. 8c (2)  FIG. 8c (3)
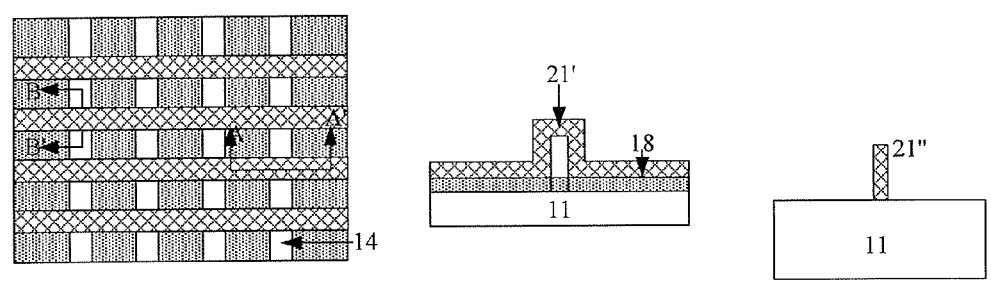
FIG. 8d (1)  FIG. 8d (2)  FIG. 8d (3)

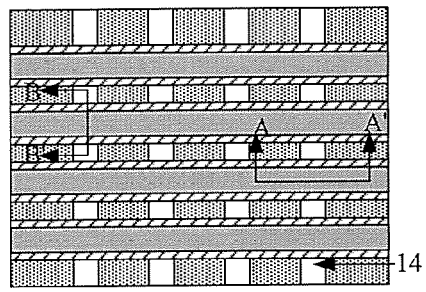 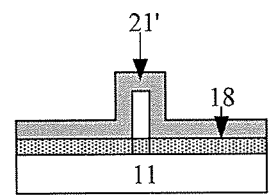 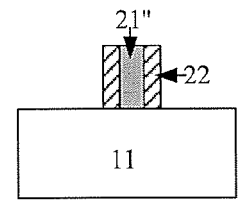
FIG. 8e (1)  FIG. 8e (2)  FIG. 8e (3)
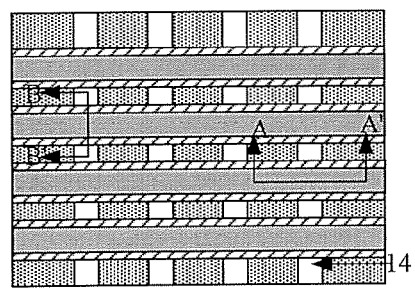 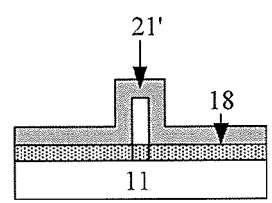 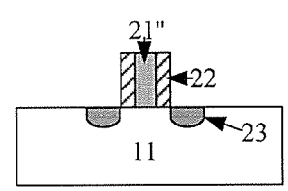
FIG. 8f (1)  FIG. 8f (2)  FIG. 8f (3)
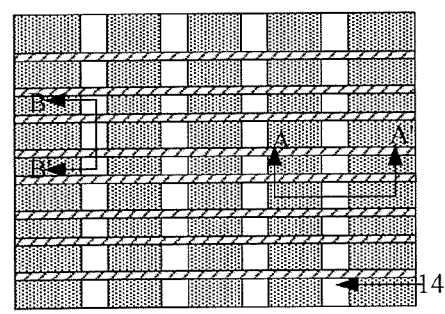 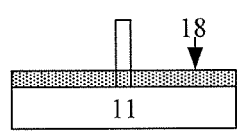 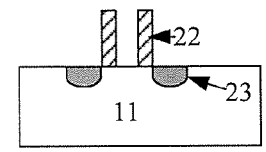
FIG. 8g (1)  FIG. 8g (2)  FIG. 8g (3)

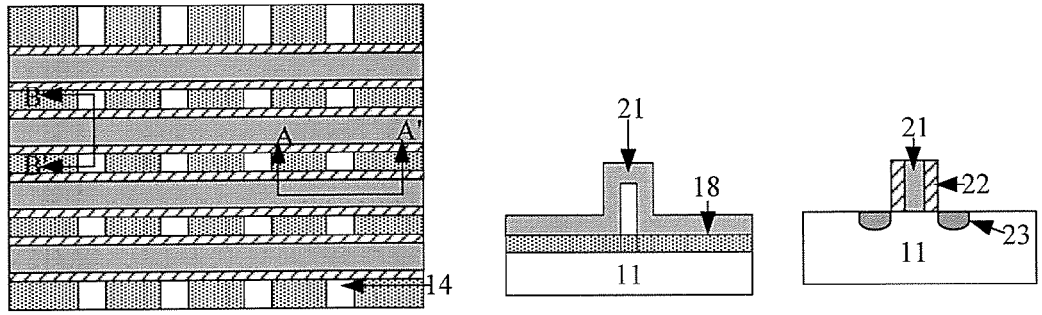
FIG. 8h (1)    FIG. 8h (2)    FIG. 8h (3)
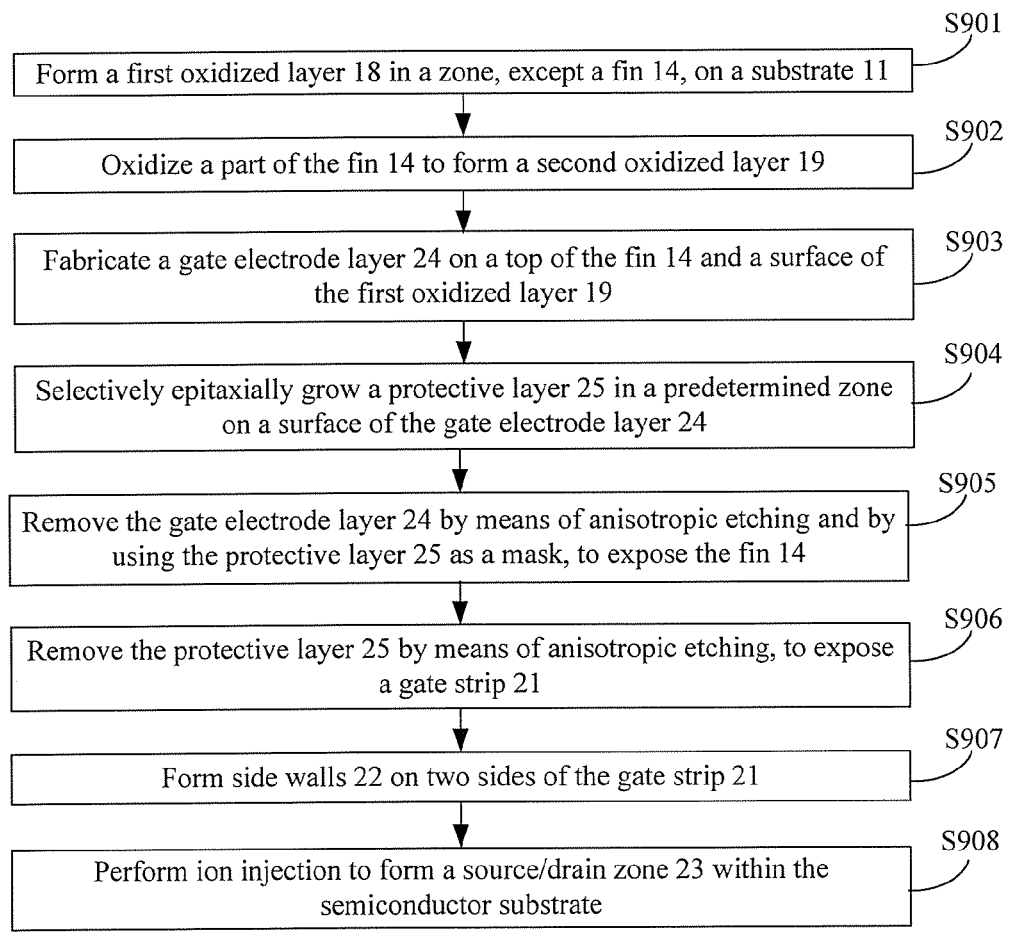
FIG. 9

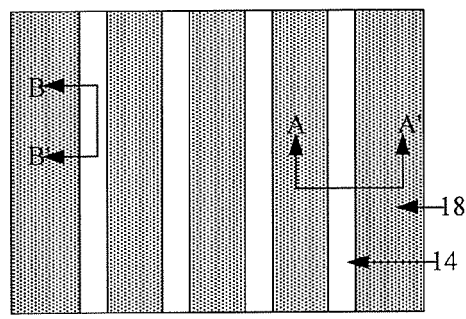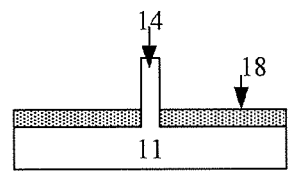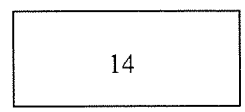
FIG. 10a (1)  FIG. 10a (2)  FIG. 10a (3)
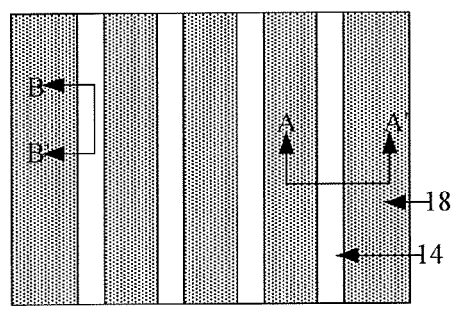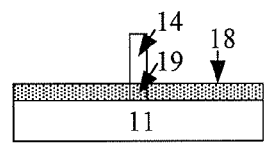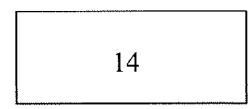
FIG. 10b (1)  FIG. 10b (2)  FIG. 10b (3)
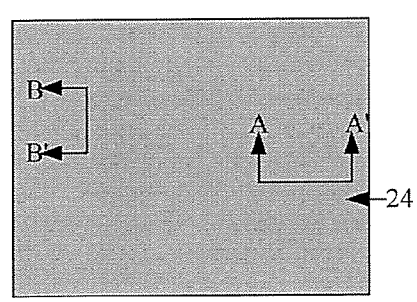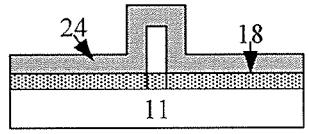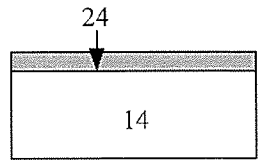
FIG. 10c (1)  FIG. 10c (2)  FIG. 10c (3)

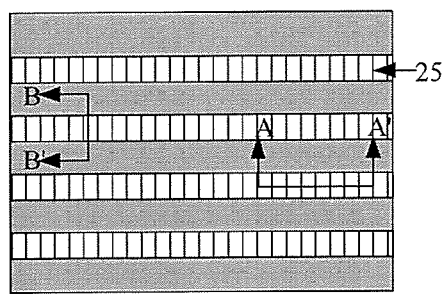
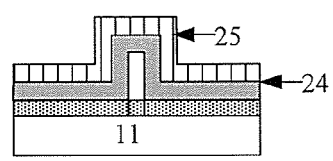
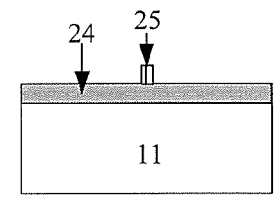
FIG. 10d (1)  FIG. 10d (2)  FIG. 10d (3)
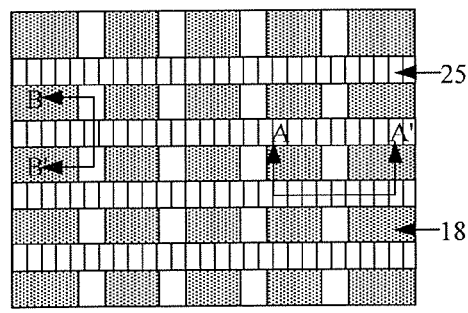
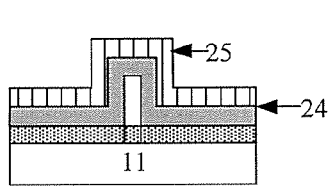
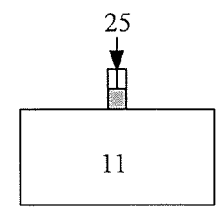
FIG. 10e (1)  FIG. 10e (2)  FIG. 10e (3)
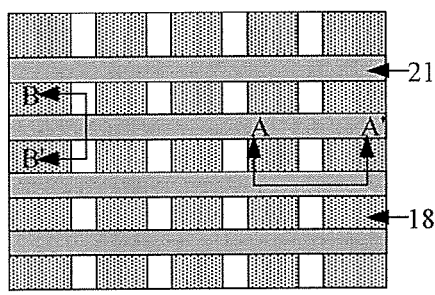
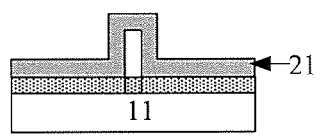
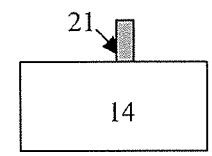
FIG. 10f (1)  FIG. 10f (2)  FIG. 10f (3)

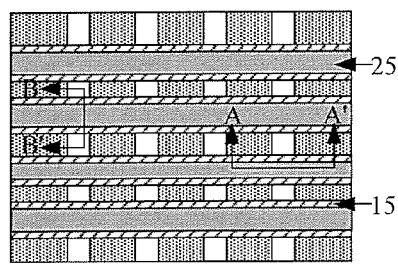 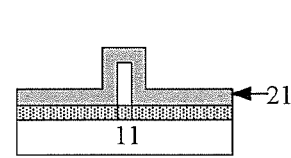 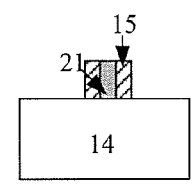
FIG. 10g (1)    FIG. 10g (2)    FIG. 10g (3)
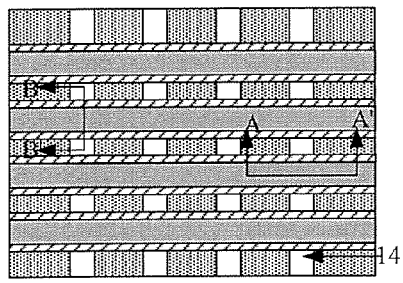 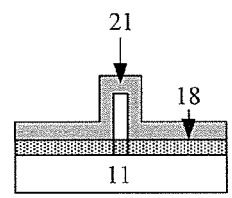 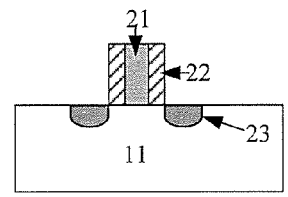
FIG. 10h (1)    FIG. 10h (2)    FIG. 10h (3)

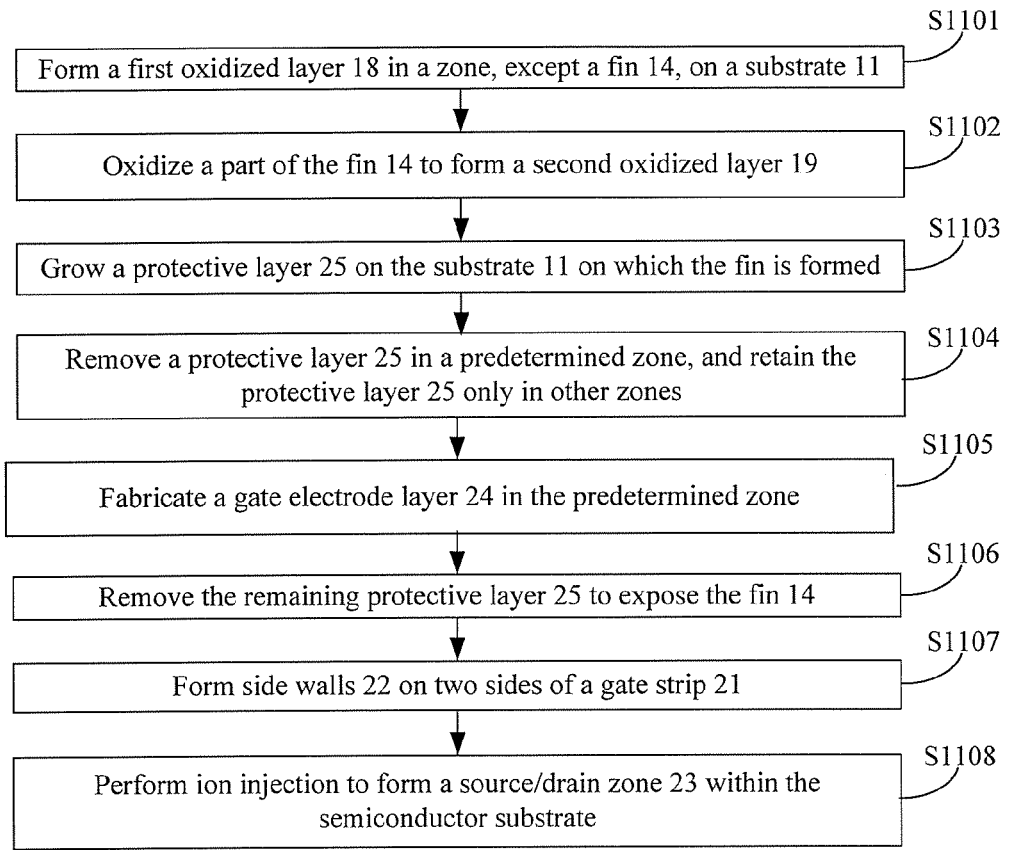
FIG. 11
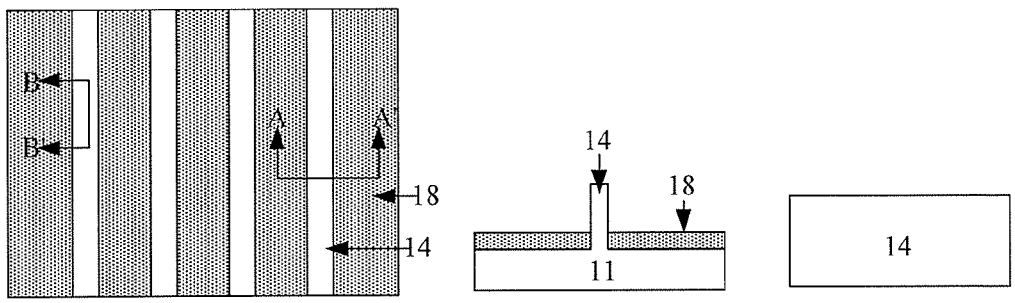
FIG. 12a (1)  FIG. 12a (2)  FIG. 12a (3)

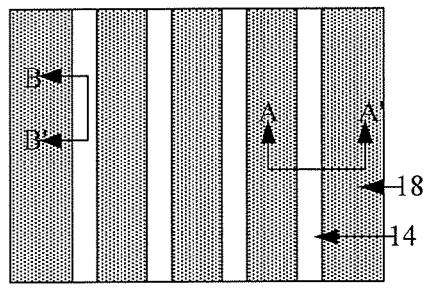 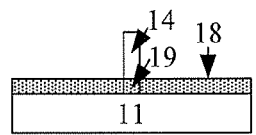 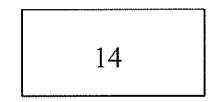
FIG. 12b (1)  FIG. 12b (2)  FIG. 12b (3)
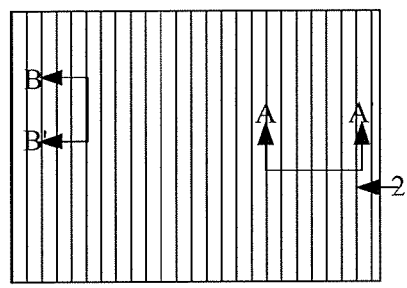 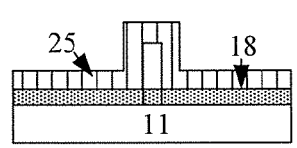 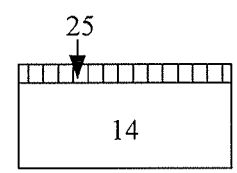
FIG. 12c (1)  FIG. 12c (2)  FIG. 12c (3)
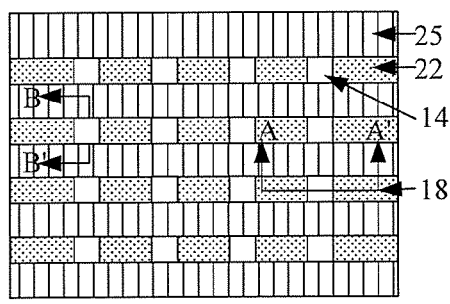 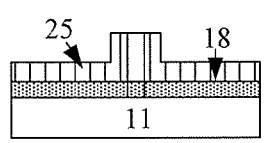 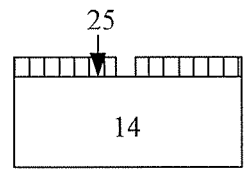
FIG. 12d (1)  FIG. 12d (2)  FIG. 12d (3)

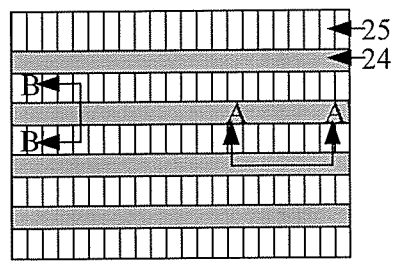 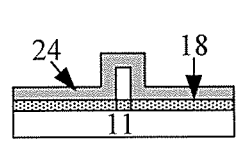 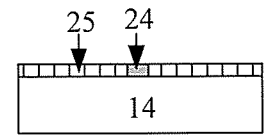
FIG. 12e (1)　　　FIG. 12e (2)　　　FIG. 12e (3)
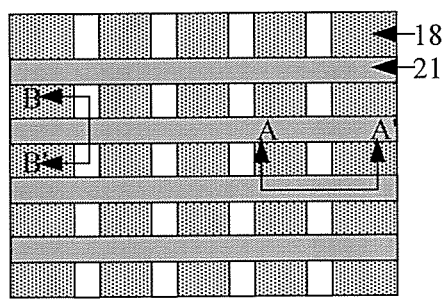 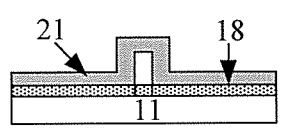 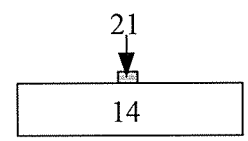
FIG. 12f (1)　　　FIG. 12f (2)　　　FIG. 12f (3)
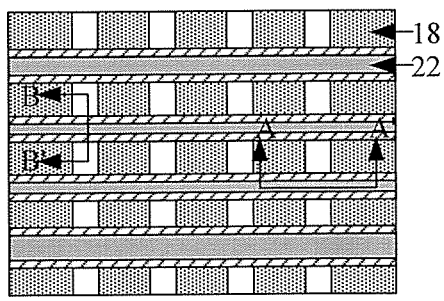 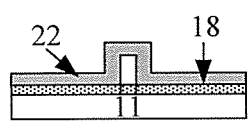 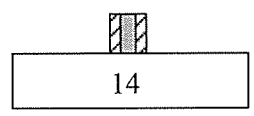
FIG. 12g (1)　　　FIG. 12g (2)　　　FIG. 12g (3)

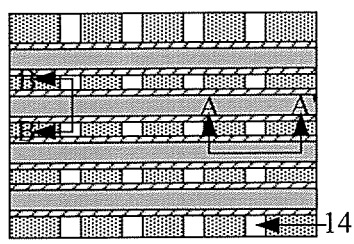 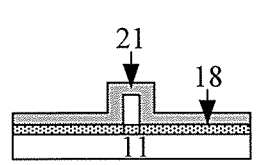 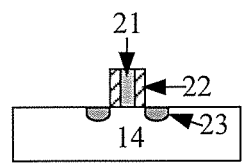
FIG. 12h (1)    FIG. 12h (2)    FIG. 12h (3)

SEMICONDUCTOR FIN FABRICATION METHOD AND FIN FET DEVICE FABRICATION METHOD

CROSS-REFERENCE TO RELATED APPLICATIONS

This application is a continuation of International Application No. PCT/CN2014/071197, filed on Jan. 23, 2014, which claims priority to Chinese Patent Application No. 201310300403.3, filed on Jul. 17, 2013, both of which are hereby incorporated by reference in their entireties.

TECHNICAL FIELD

The present invention belongs to the field of large-scale integrated circuit manufacturing technologies, and specifically, relates to a semiconductor fin fabrication method and a method for fabricating a Fin FET device using the semiconductor fin.

BACKGROUND

As Moore's Law advances into a 22-nm technology node, a traditional planar field-effect transistor cannot meet a requirement of low power consumption and high performance. To overcome a short-channel effect and increase a density of driving current in a unit area, a large-scale integrated circuit manufacturing technology is introduced to a fin field-effect transistor (Fin Field-Effect Transistor; Fin FET) having a three-dimensional structure. Due to a larger gate control area and a narrower channel depletion zone, this structure has a very outstanding short-channel control capability and very high driving current.

A Fin FET is an emerging structure. The structure includes a narrow and independent fin, where gates are on two sides of the fin. An advantage lies in that gates of a channel may be controlled from the two sides, so that a device is smaller, and has higher performance and lower power consumption. The fin in the Fin FET includes a source zone and a drain zone, and an active zone of the fin is segmented by means of shallow trench isolation (STI). The Fin FET further includes a gate zone located between the source zone and the drain zone. The gate zone is formed on an upper surface and side walls of the fin, so that the gate zone wraps and surrounds the fin. A part, extending under the gate and located between the source zone and the drain zone, of the fin is a channel zone.

In the prior art, a fin in a Fin FET device is generally fabricated by using a photoetching technology. However, the fin fabricated by using the photoetching technology has a rough side surface, and the fin cannot be perpendicular to a surface of a substrate.

SUMMARY

In view of this, embodiments of the present invention provide a method for fabricating a semiconductor fin with a smooth side surface and being perpendicular to a surface of a substrate, so as to solve a problem in the prior art that a side surface of a fin is rough and the fin cannot be perpendicular to a surface of a substrate.

According to a first aspect, an embodiment of the present invention provides a semiconductor fin fabrication method, including:
providing a substrate;
selectively epitaxially growing a first mask layer in a predetermined zone on the substrate;
selectively epitaxially growing a first epitaxial layer on the substrate by using the first mask layer as a mask; and
removing the first mask layer and a part, under the first mask layer, of the substrate by using the first epitaxial layer as a mask and by using an anisotropic etching method, so as to form a fin under the first epitaxial layer.

In a first possible implementation manner of the first aspect, the method further includes:
removing the first epitaxial layer by means of etching.

In a second possible implementation manner of the first aspect, the method further includes:
performing rounding processing on a top of the fin by using a high-temperature oxidation method.

In a third possible implementation manner of the first aspect, the method further includes:
forming flank walls on two sides of the fin;
forming second mask layers on outer sides of the flank walls;
selectively epitaxially growing new fins on outer sides of the second mask layers; and
removing the fin, the flank walls, and the second mask layers by means of anisotropic etching, to expose the new fins.

In a third possible implementation manner of the first aspect, in a fourth possible implementation manner, spacings between two adjacent fins are equal.

In a fourth possible implementation manner of the first aspect, a technical condition of the selective epitaxial growth is that: a growth atmosphere is chlorine-containing silicon source gas, and a growth temperature is 750° C. to 900° C.

With reference to the first aspect or any one of the first to fourth possible implementation manners of the first aspect, in a fifth possible implementation manner, the method further includes:
forming a first oxidized layer in a zone, except the fin, on the substrate; and
oxidizing a part of the fin to form a second oxidized layer, where the second oxidized layer comes into contact with the substrate, and a height of the second oxidized layer is the same as a height of the first oxidized layer, where
the substrate is one of a silicon substrate, a DDS substrate, and an FD-SOI substrate.

According to a second aspect, an embodiment of the present invention provides a Fin FET device fabrication method, including:
providing a substrate on which a fin is formed, where the fin is fabricated by using the fabrication method according to any one of claims 1 to 6;
forming a first oxidized layer in a zone, except the fin, on the substrate;
oxidizing a part of the fin to form a second oxidized layer, where the second oxidized layer comes into contact with the substrate, and a height of the second oxidized layer is the same as a height of the first oxidized layer;
performing rounding processing on top corners of the fin by using a high-temperature oxidation method;
forming lateral walls on two sides of the fin;
forming a gate strip intersecting with the fin;
forming side walls on two sides of the gate strip; and
performing ion injection by using the side walls as masks, to form a source/drain zone within the substrate.

In a first possible implementation manner of the second aspect, the forming a gate strip intersecting with the fin includes:

forming an epitaxial layer on a top of the fin, tops of the lateral walls, and a surface of the first oxidized layer;

removing an excess epitaxial layer by means of etching, to form the gate strip intersecting with the fin;

or forming a protective layer, along a length direction of the fin, from two sides to the middle of the substrate by means of selective epitaxial growth until a trench is formed in a middle location along the length direction of the fin;

forming the gate strip within the trench by means of deposition; and removing the protective layer by means of etching, to expose the fin.

According to a third aspect, an embodiment of the present invention provides a Fin FET device fabrication method, including:

providing a substrate on which a fin is formed, where the fin is fabricated by using the fabricating method according to the first aspect or any one of the first to fifth possible implementation manners of the first aspect;

depositing a pseudo gate layer on a top of the fin and a surface of the gate oxidized layer;

removing an excess pseudo gate layer by means of etching, to form a pseudo gate strip intersecting with the fin;

forming side walls on two sides of the pseudo gate strip; performing ion injection by using the side walls as masks, to form a source/drain zone within the substrate;

removing the pseudo gate strip; and forming a gate strip on the gate oxidized layer between the side walls.

According to a fourth aspect, an embodiment of the present invention provides a Fin FET device fabrication method, including:

providing a substrate on which a fin is formed, where the fin is fabricated by using the fabrication method according to any one of claims 1 to 6;

forming a first oxidized layer in a zone, except the fin, on the substrate;

oxidizing apart of the fin to forma second oxidized layer, where the second oxidized layer comes into contact with the substrate, and a height of the second oxidized layer is the same as a height of the first oxidized layer;

fabricating a gate electrode layer on a top of the fin and a surface of the first oxidized layer;

selectively epitaxially growing a protective layer in a predetermined zone on a surface of the gate electrode layer, where the gate electrode layer under the predetermined zone intersects with the fin;

removing the gate electrode layer by means of anisotropic etching and by using the protective layer as a mask, to expose the fin;

removing the protective layer by means of anisotropic etching;

forming side walls on two sides of the gate strip; and performing ion injection by using the side walls as masks, to form a source/drain zone within the substrate.

According to a fifth aspect, an embodiment of the present invention provides a Fin FET device fabrication method, including:

providing a substrate on which a fin is formed, where the fin is fabricated by using the fabrication method according to any one of claims 1 to 6;

forming a first oxidized layer in a zone, except the fin, on the substrate;

oxidizing a part of the fin to form a second oxidized layer, where the second oxidized layer comes into contact with the substrate, and a height of the second oxidized layer is the same as a height of the first oxidized layer;

depositing a protective layer on a top of the fin and a surface of the first oxidized layer;

removing the protective layer in a predetermined zone by means of anisotropic etching, where the predetermined zone is a zone in which a gate strip is located;

growing a gate electrode layer in the predetermined zone;

removing the protective layer on the top of the fin to expose the fin;

forming side walls on two sides of the gate strip; and performing ion injection by using the side walls as masks, to form a source/drain zone within the substrate.

According to the foregoing solutions, a manner in which a selective epitaxial growth technology and an anisotropic etching technology are combined is used, and a photoetching technology is not needed. Therefore, it can be ensured that a semiconductor fin and a surface of a gate oxidized layer are perpendicular to each other, roughness of a surface of the semiconductor fin is reduced, and a fin with a smooth side surface is formed.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

FIG. 1 is a schematic flowchart according to Embodiment 1 of the present invention;

FIG. 2a (1) to FIG. 2e (2) are schematic structural diagrams of a semiconductor fin at all stages according to Embodiment 1 of the present invention, where FIG. (1) is a top view, and FIG. (2) is a sectional view of FIG. (1) in an AA' direction.

FIG. 6a (1) to FIG. 6l (3) are schematic structural diagrams of a Fin FET device at all stages according to Embodiment 3 of the present invention, where FIG. (1) is a top view, FIG. (2) is a sectional view of FIG. (1) in an AA' direction, and FIG. (3) is a sectional view of FIG. (1) in a BB' direction;

FIG. 7 is a schematic flowchart according to Embodiment 4 of the present invention;

FIG. 8a (1) to FIG. 8h (3) are schematic structural diagrams at all stages according to Embodiment 4 of the present invention, where FIG. 1) is a top view, FIG. 2) is a sectional view of FIG. (1) in an AA' direction, and FIG. 3) is a sectional view of FIG. (1) in a BB' direction;

FIG. 9 is a schematic flowchart according to Embodiment 5 of the present invention;

FIG. 10a (1) to FIG. 10h (3) are schematic structural diagrams at all stages according to Embodiment 5 of the present invention, where FIG. 1) is a top view, FIG. (2) is a sectional view of FIG. (1) in an AA' direction, and FIG. (3) is a sectional view of FIG. (1) in a BB' direction;

FIG. 11 is a schematic flowchart according to Embodiment 6 of the present invention;

FIG. 12a (1) to FIG. 12h (3) are schematic structural diagrams at all stages according to Embodiment 6 of the present invention, where FIG. (1) is a top view, FIG. (2) is a sectional view of FIG. (1) in an AA' direction, and FIG. (3) is a sectional view of FIG. (1) in a BB' direction; and Reference numerals: 11-substrate, 12-first mask layer, 13-first epitaxial layer, 14-fin, 15-flank wall, 16-second mask layer, 17-new fin, 18-first oxidized layer, 19-second oxidized layer, 20-lateral wall, 21-gate strip, 21'-pseudo gate layer, 21"-pseudo gate strip, 22-side wall, 23-source/drain zone, 24-gate electrode layer, and 25-protective layer.

DETAILED DESCRIPTION

Figure 3:
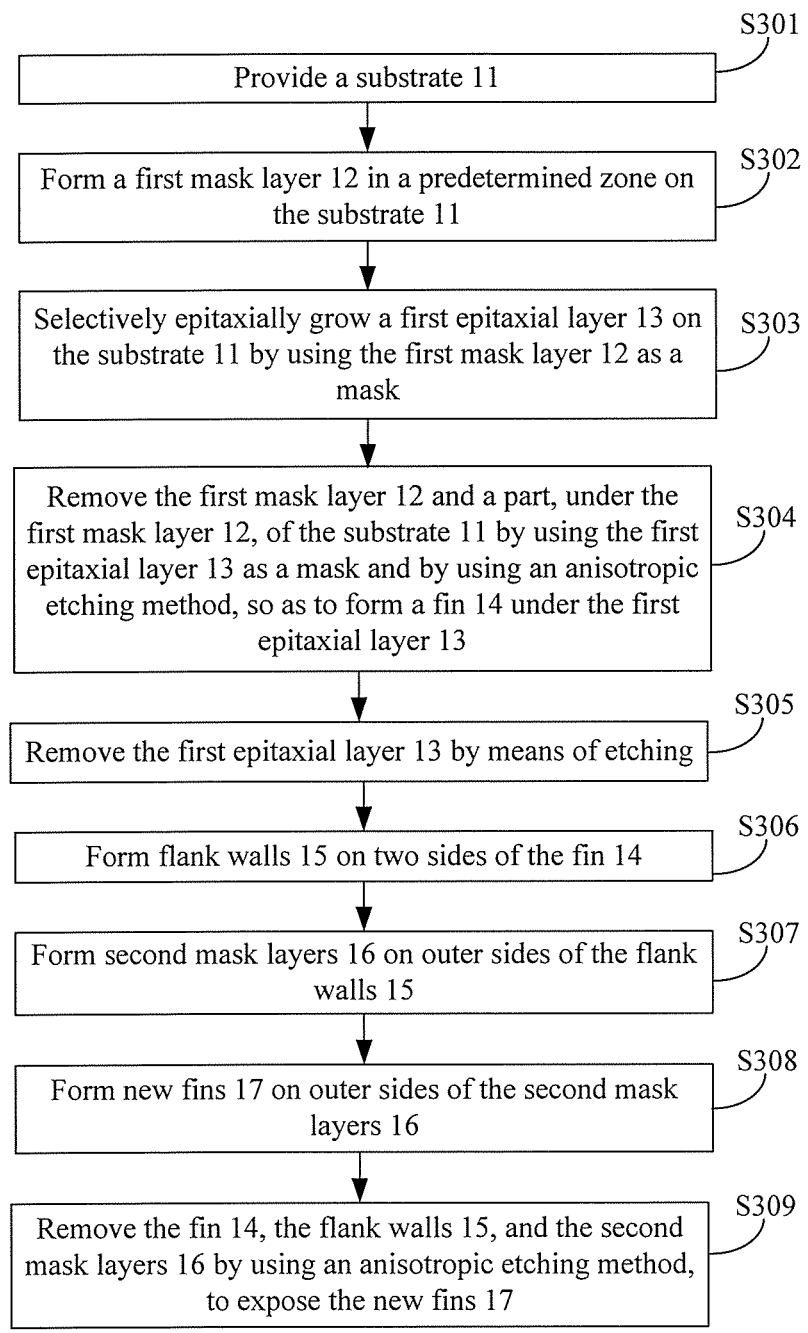
FIG. 3 is a schematic flowchart according to Embodiment 2 of the present invention.

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

To solve problems in the prior art that a side surface of a semiconductor fin is rough and the semiconductor fin is not perpendicular to a surface of a substrate, the present invention provides the following technical solutions, so as to fabricate a high-quality semiconductor fin.

Embodiment 1

FIG. 1 is a schematic flowchart of a semiconductor fin fabrication method according to this embodiment of the present invention. FIG. 2a (1) to FIG. 2d (2) are schematic structural diagrams of a semiconductor fin at all stages of a fabrication process, where FIG. (1) is a top view, and FIG. (2) is a sectional view of FIG. (1) in an AA' direction. With reference to FIG. 1 to FIG. 2d (2), a procedure of the semiconductor fin fabrication method is as follows:

S101: Provide a substrate 11, as shown in FIG. 2a (1) and FIG. 2a (2).

The substrate 11 in Embodiment 1 of the present invention is a bulk silicon substrate. The bulk silicon substrate may be a P-well substrate, an N-well substrate, or a twin-well substrate.

S102: Form a first mask layer 12 in a predetermined zone on the substrate 11, as shown in FIG. 2b (1) and FIG. 2b (2).

The first mask layer 12 may be fabricated by using a selective epitaxial growth technology, for example, in a low pressure chemical vapor deposition (low pressure chemical vapor deposition, LPCVD) manner or a physical vapor deposition (Physical vapor deposition, PVD) manner. A material of the first mask layer 12 is silicon oxide or silicon nitride. There is a blank zone between two adjacent first mask zones of the first mask layer 12 (the substrate 11 is under the blank zone, and no silicon oxide or silicon nitride is padded in the blank zone). In a selective epitaxial growth process, a width of the blank zone may be controlled within a specific size to meet different technical requirements, and the width of the blank zone may be controlled by controlling a technical condition for selective epitaxial growth.

In a specific example of the present invention, in the selective epitaxial growth process, the following growth conditions are used: a growth atmosphere is chlorine-containing silicon source gas, and a growth temperature is set to 750° C. to 900° C.

After S102, the first mask layer 12 is formed on a surface of the substrate 11, where the first mask layer 12 includes multiple first mask zones, each first mask zone covers a particular zone on the surface of the substrate 11, and there is a blank zone between two adjacent first mask zones. Widths L1 of different first mask zones may be equal or may be unequal. In an exemplary embodiment, widths L1 of different first mask zones are equal. Specifically, the technical condition for selective epitaxial growth (such as the growth temperature, growth time, and gas flow) may be controlled to enable the widths L1 of the different first mask zones to be equal.

S103: Selectively epitaxially grow a first epitaxial layer 13 on the substrate 11 by using the first mask layer 12 as a mask, as shown in FIG. 2c (1) and FIG. 2c (2).

After S102, there is a blank zone between two adjacent first mask zones of the first mask layer 12, and the first epitaxial layer 13 is selectively epitaxially grown in these blank zones by using the selective epitaxial growth technology. A material of the first epitaxial layer 13 is metal silicide.

Widths L2 of different first epitaxial layers 13 may be equal, or may be unequal (a width of a single first epitaxial layer 1314 is a width of the blank zone in S102). In an exemplary embodiment, widths of different first epitaxial layers 13 are equal, and spacings between two adjacent first epitaxial layers 13 are equal. Specifically, the technical condition of S102 may be controlled to enable the widths L1 of the first mask zones to be equal, and enable widths L2 of the blank zones between two adjacent first mask zones to be equal, so that the widths of the first epitaxial layers 13 formed in S103 are equal, and the spacings between two adjacent first epitaxial layers 13 are equal.

S104: Remove the first mask layer 12 and a part, under the first mask layer 12, of the substrate 11 by using the first epitaxial layer 13 as a mask and by using an anisotropic etching method, so as to form a fin 14 under the first epitaxial layer 13, as shown in FIG. 2d (1) and FIG. 2d (2).

The first mask layer 12 is removed by using the anisotropic etching method, so that a geometrical dimension of the fin 14 can be accurately controlled, to ensure that the fin 14 and the surface of the substrate 11 are perpendicular to each other, and roughness of the surface of the fin 14 is reduced, to ensure that a side surface of the fin 14 is smooth. A fin with a smooth side surface and being perpendicular to the substrate enables a gate to come into closer contact with the fin and the substrate, thereby implementing full contact.

In addition, in Embodiment 1 of the present invention, S105 may be further performed.

S105: Remove the first epitaxial layer 13 by means of etching, as shown in FIG. 2e (1) and FIG. 2e (2).

According to the semiconductor fin fabrication method provided in this embodiment of the present invention, a first epitaxial layer is grown by using a selective epitaxial growth technology, and a first mask layer is removed by using an anisotropic etching technology, to form a semiconductor fin. Compared with the prior art, in the semiconductor fin fabrication method provided in this embodiment of the present invention, a manner in which a selective epitaxial growth technology and an anisotropic etching technology are combined is used, and a photoetching technology is not needed. Therefore, it can be ensured that a semiconductor fin and a surface of a substrate are perpendicular to each other, roughness of a surface of the semiconductor fin is reduced, and a fin with a smooth side surface is formed.

In addition, to reduce current leakage of a semiconductor device using the foregoing semiconductor fin and further improve electrical performance of the semiconductor device using the semiconductor fin, in this embodiment of the present invention, rounding processing may be further performed on top corners of the fin 14, that is, passivation is performed on the corners of the fin 14, and related content is to be described in detail in the following.

In addition, the substrate in this embodiment of the present invention may also be an SOI substrate. In this case, a semiconductor fin forming technology is as follows: the substrate 11 is formed by a semiconductor base, an buried insulation layer, and a top semiconductor layer, a thickness of the top semiconductor layer may match a height of a fin, a part of the top semiconductor layer is removed by using the anisotropic etching technology, the top semiconductor layer only in a predetermined zone over the buried insulation layer is retained, and the retained top semiconductor layer is a fin. In addition, the substrate 11 may also be a deeply depleted channel (Deeply Depleted Channel, DDC) substrate, a fully depleted semiconductor on insulator (Fully Depleted Semiconductor On Insulator, FD-SOI) substrate, or the like, which is not limited in the present invention.

The foregoing Embodiment 1 describes in detail the semiconductor fin fabrication method. In addition, the semiconductor fin fabrication method in this embodiment of the present invention may also be implemented in another manner. The following Embodiment 2 provides another semiconductor fin fabrication method.

Embodiment 2

Figure 4A:
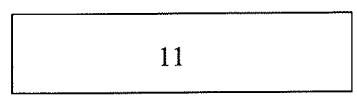
FIG. 4a to FIG. 4i are schematic structural diagrams of a semiconductor fin at all stages according to Embodiment 2 of the present invention.
Figure 4B:
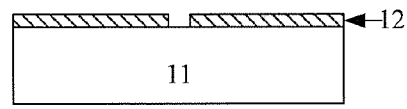
Figure 4C:
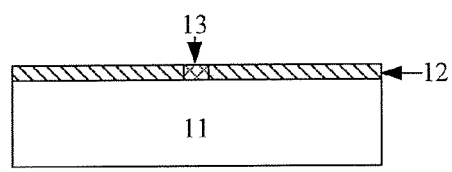
Figure 4D:
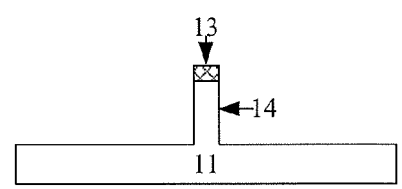
Figure 4E:
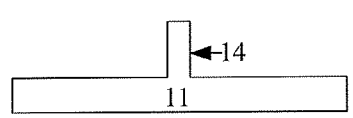
Figure 4F:
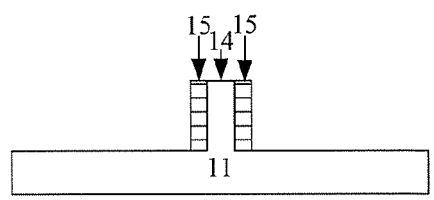
Figure 4G:
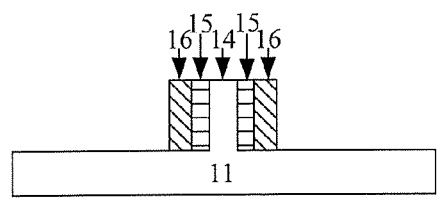
Figure 4H:
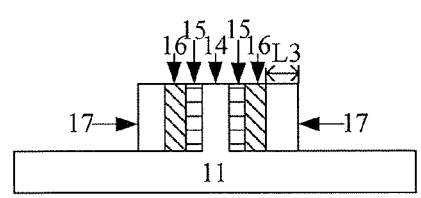
Figure 4I:
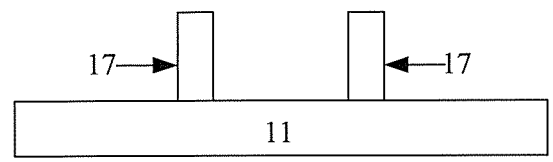

FIG. 3 is a schematic flowchart of a semiconductor fin fabrication method according to this embodiment of the present invention. FIG. 4a to FIG. 4i are schematic structural diagrams of a semiconductor fin at all stages of a fabrication process. With reference to FIG. 3 to FIG. 4i, a procedure of the semiconductor fin fabrication method is as follows:

Considering that S301 to S305 are the same as or correspond to S101 to S105 in the foregoing embodiment, correspondingly, FIG. 4a to FIG. 4e are the same as or correspond to FIG. 2a (2) to FIG. 2d (2), and details are not described herein again. For specific content, refer to a related description in the foregoing embodiment.

S306: Form flank walls 15 on two sides of the fin 14, as shown in FIG. 4f.

The flank walls 15 are formed on the two sides of the fin 14 in a manner of combining deposition and back-etching. For example, one or more layers of materials (such as silicon oxide, silicon nitride, or silicon oxynitride, or a combination of these materials) are deposited on a top of the fin 14 and a surface of the substrate 11 in an LPCVD manner, a PVD manner, or the like, and then, the flank walls 15 are formed on the two sides of the fin 14 by using a back-etching technology.

S307: Form second mask layers 16 on outer sides of the flank walls 15, as shown in FIG. 4g.

A material of the second mask layers 16 is one of silicon oxide, silicon nitride, and silicon oxynitride. The second mask layers 16 may be fabricated by using a technology similar to that for fabricating the flank walls 15.

S308: Form new fins 17 on outer sides of the second mask layers 16, as shown in FIG. 4h.

The new fins 17 are formed on the outer sides of the second mask layers 16 by using a selective epitaxial growth technology. In an actual fabrication process, widths L3 of the new fins 17 may be changed by changing a technical condition (such as cavity pressure, gas flow, or a growth temperature) of the selective epitaxial growth technology. A material of the new fins 17 is monocrystalline silicon.

S309: Remove the fin 14, the flank walls 15, and the second mask layers 16 by using an anisotropic etching method, to expose the new fins 17, as shown in FIG. 4i.

In an exemplary embodiment, distances between two adjacent new fins 17 are equal.

An even quantity of fins may be fabricated by using the foregoing method in Embodiment 2, and an odd quantity of fins or an even quantity of fins may be fabricated by using the foregoing method in Embodiment 1.

In addition, to reduce current leakage of a semiconductor device using the foregoing semiconductor fin and further improve electrical performance of the semiconductor device, in this embodiment of the present invention, rounding processing may be further performed on tops of the new fins 17, that is, passivation is performed on corners of the new fins 17. In the semiconductor device, an electric field is generally concentrated on corners of a fin. In this embodiment of the present invention, rounding processing is performed on corners of a fin, which helps to reduce current leakage of a finally fabricated device.

In the foregoing embodiment, the method for fabricating an odd quantity of fins or an even quantity of fins is described in detail. Correspondingly, an embodiment of the present invention further provides a Fin FET device fabrication method, where the Fin FET device uses a semiconductor fin fabricated by using the fabrication method in the foregoing embodiments.

Embodiment 3

Figure 5:
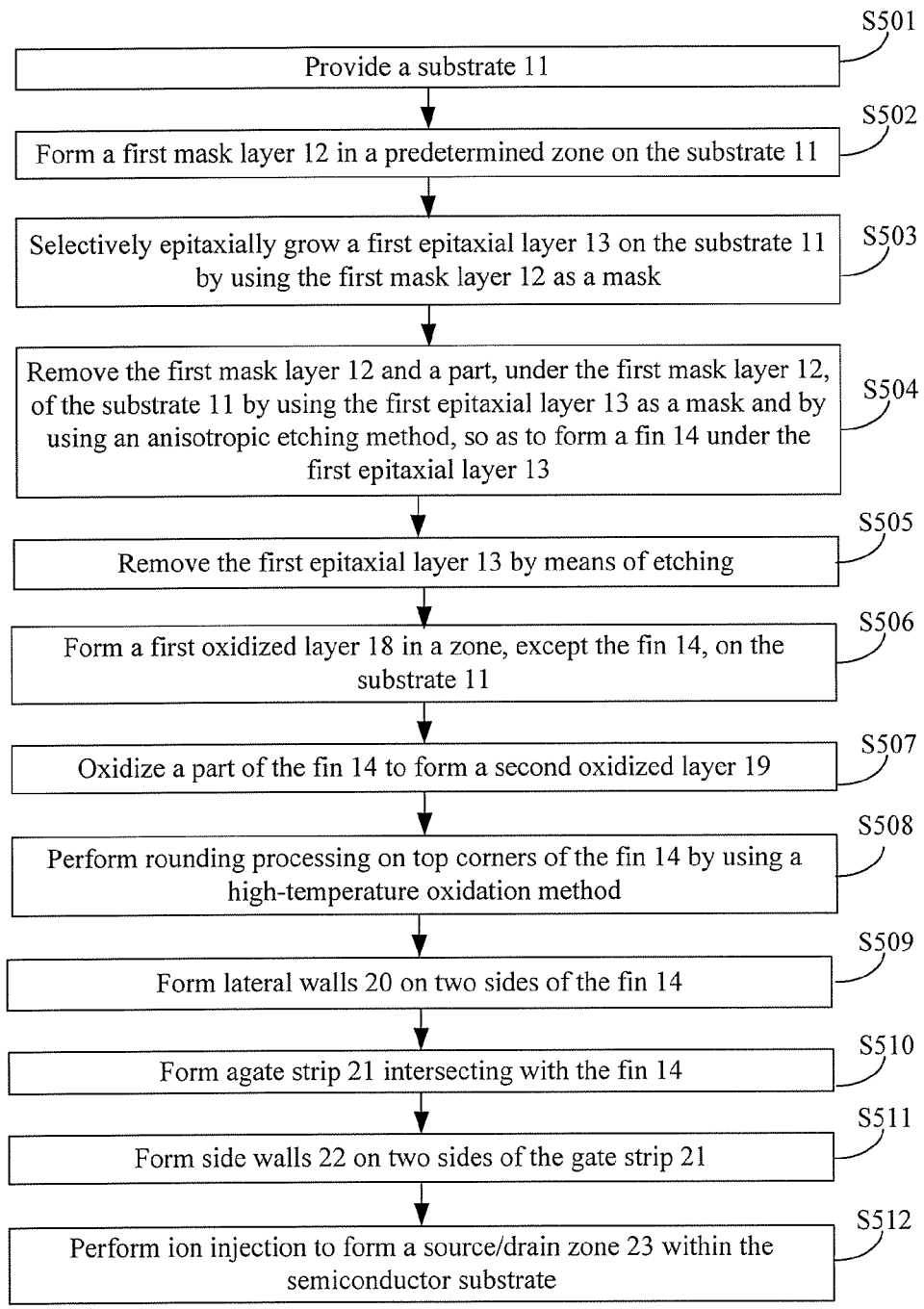
FIG. 5 is a schematic flowchart according to Embodiment 3 of the present invention.

FIG. 5 is a schematic flowchart of a Fin FET device fabrication method according to this embodiment of the present invention, where the Fin FET device uses a semiconductor fin fabricated by using the fabrication method in the foregoing embodiments. FIG. 6a (1) to FIG. 6l (3) are schematic structural diagrams of a Fin FET device at all stages of a fabrication process, where FIG. (1) is a top view, FIG. (2) is a sectional view of FIG. (1) in an AA' direction, and FIG. (3) is a sectional view of FIG. (1) in a BB' direction. With reference to FIG. 5 to FIG. 6l (3), a procedure of the Fin FET device fabrication method is as follows:

S501: Provide a substrate 11, as shown in FIG. 6a (1) and FIG. 6a (2).

The substrate 11 in this embodiment of the present invention is a bulk silicon substrate. The bulk silicon substrate may be a P-well substrate, an N-well substrate, or a twin-well substrate.

S502: Form a first mask layer 12 in a predetermined zone on the substrate 11, as shown in FIG. 6b (1) and FIG. 6b (2).

The first mask layer 12 may be fabricated by using a selective epitaxial growth technology, for example, in a low pressure chemical vapor deposition (low pressure chemical vapor deposition, LPCVD) manner or a physical vapor deposition (Physical vapor deposition, PVD) manner. A material of the first mask layer 12 is silicon oxide or silicon nitride. There is a blank zone between two adjacent first mask zones of the first mask layer 12 (the substrate 11 is under the blank zone, and no silicon oxide or silicon nitride is padded in the blank zone). In a selective epitaxial growth process, a width of the blank zone may be controlled within a specific size to meet different technical requirements, and a width W of the blank zone may be controlled by controlling a technical condition for selective epitaxial growth.

In a specific example of the present invention, in the selective epitaxial growth process, the following growth conditions are used: a growth atmosphere is chlorine-containing silicon source gas, and a growth temperature is set to 750° C. to 900° C.

After S502, the first mask layer 12 is formed on a surface of the substrate 11, where the first mask layer 12 includes multiple first mask zones, each first mask zone covers a particular zone on the surface of the substrate 11, and there is a blank zone between two adjacent first mask zones. Widths L1 of different first mask zones may be equal or may be unequal. In an exemplary embodiment, widths L1 of different first mask zones are equal. Specifically, the technical condition for selective epitaxial growth (such as the growth temperature, growth time, and gas flow) may be controlled to enable the widths L1 of the different first mask zones to be equal.

S503: Selectively epitaxially grow a first epitaxial layer 13 on the substrate 11 by using the first mask layer 12 as a mask, as shown in FIG. 6c (1), FIG. 6c (2), and FIG. 6c (3).

After S102, there is a blank zone between two adjacent first mask zones of the first mask layer 12, and the first epitaxial layer 13 is selectively epitaxially grown in these blank zones by using the selective epitaxial growth technology. A first mask zone is between two adjacent first epitaxial layers 13. A material of the first epitaxial layer 13 is metal silicide.

Widths of different first epitaxial layers 13 may be equal, or may be unequal. In an exemplary embodiment, widths of different first epitaxial layers 13 are equal, and spacings between two adjacent first epitaxial layers 13 are equal. Specifically, the technical condition of S502 may be controlled to enable the widths of the first mask zones to be equal, and enable widths of the blank zones between two adjacent first mask zones to be equal, so that the widths of the first epitaxial layers 13 formed in S503 are equal, and the spacings between two adjacent first epitaxial layers 13 are equal.

S504: Remove the first mask layer 12 and a part, under the first mask layer 12, of the substrate 11 by using the first epitaxial layer 13 as a mask and by using an anisotropic etching method, so as to form a fin 14 under the first epitaxial layer 13, as shown in FIG. 6d (1), FIG. 6d (2), and FIG. 6d (3).

The first mask layer 12 is removed by using the anisotropic etching method, so that a geometrical dimension of the fin 14 can be accurately controlled, to ensure that the fin 14 and a surface of a gate oxidized layer 12 are perpendicular to each other, and roughness of the surface of the fin 14 is reduced, to ensure that a side surface of the fin 14 is smooth.

S505: Remove the first epitaxial layer 13 by means of etching, as shown in FIG. 6e (1), FIG. 6e (2), and FIG. 6e (3).

S506: Form a first oxidized layer 18 in a zone, except the fin 14, on the substrate 11, as shown in FIG. 6f (1), FIG. 6f (2), and FIG. 6f (3).

The first oxidized layer 18 is formed in the zone, except the fin 14, on the substrate 11 in a manner of dry oxidation, thermal oxidation, or the like. The first oxidized layer 18 may be used as a gate oxidized layer of a semiconductor device to isolate, from the substrate, a gate that is to be fabricated subsequently.

S507: Oxidize a part of the fin 14 to form a second oxidized layer 19, where the second oxidized layer 19 is located between the substrate 11 and the fin 14, and a height of the second oxidized layer 19 is the same as a height of the first oxidized layer 19, as shown in FIG. 6g (1), FIG. 6g (2), and FIG. 6g (3).

The second oxidized layer 19 is fabricated between the fin 14 and the substrate 11 to isolate the fin from the substrate in the semiconductor device. The second oxidized layer 19 may be fabricated by using a dry oxidation method, a thermal oxidation method, or the like, so that the second oxidized layer 19 comes into contact with the first oxidized layer 18.

S508: Perform rounding processing on top corners of the fin 14 by using a high-temperature oxidation method, as shown in FIG. 6h (1), FIG. 6h (2), and FIG. 6h (3).

Performing the rounding processing on the top corners of the fin 14 helps to reduce current leakage of the semiconductor device. In the semiconductor device, an electric field is generally concentrated on corners of a fin. In this embodiment of the present invention, rounding processing is performed on corners of a fin, which helps to reduce current leakage of a finally fabricated device.

In addition, S508 may also be performed before S506, or may be performed between S506 and S507.

S509: Form lateral walls 20 on two sides of the fin 14, as shown in FIG. 6i (1), FIG. 6i (2), and FIG. 6i (3).

A material of the lateral walls 20 is silicon nitride. A layer of silicon nitride is first grown on a top and side surfaces of the fin 14, and the surface of the substrate 11, and then, the silicon nitride is back-etched to form the lateral walls 20 on the two sides of the fin 14.

S510: Form a gate strip 21 intersecting with the fin 14, as shown in FIG. 6j (1), FIG. 6j (2), and FIG. 6j (3).

The gate strip 21 intersects with the fin 14, and a width of the gate strip 21 is equal to a width of a channel (not shown in the figure). The channel is located at a part, in contact with the fin 14, under the gate strip 21.

S510 may be performed by using either of the following two methods:

Method 1: An epitaxial layer (not shown in the figure) is first formed on the top of the fin 14, tops of the lateral walls 20, and a surface of the first oxidized layer 18, and then, the epitaxial layer is etched to form the gate strip 21 intersecting with the fin 14. The epitaxial layer may be formed in a manner of epitaxial growth, deposition, or the like. A material of the epitaxial layer is polycrystalline silicon; in addition, the material of the epitaxial layer may also be metal. In this case, the epitaxial layer may be formed by using a PVD method, for example, magnetron sputtering.

Method 2: A protective layer (not shown in the figure) is formed, along a length direction of the fin 14, from two sides to the middle of the substrate by using the selective epitaxial growth technology, until a trench is formed in a middle location along the length direction of the fin 14; then, a gate strip is formed by means of deposition in the trench; and finally, the protective layer is removed by means of etching, to expose the gate strip.

In addition, a person of ordinary skill in the art may also perform S510 in other manners, which are not enumerated herein.

S511: Form side walls 22 on two sides of the gate strip 21, as shown in FIG. 6k (1), FIG. 6k (2), and FIG. 6k (3).

An epitaxial layer is first formed on a top of the gate strip 21, and tops and surfaces of other structures (including the gate oxidized layer, the fin, and the lateral walls), for example, by using a CVD technology or an epitaxial growth technology, and the epitaxial layer uses, for example, silicon nitride. Then, the epitaxial layer is back-etched to form the side walls 22 on the two sides of the gate strip 21.

S512: Perform ion injection to form a source/drain zone 23 within the semiconductor substrate, as shown in FIG. 6*l* (1), FIG. 6*l* (2), and FIG. 6*l* (3).

The side walls 22 on the two sides of the gate strip 21 are used as masks, and ions are injected into the substrate 11 along outer sides of the side walls 22 to form a source/drain zone. Preferably, after the ion injection is completed, quick annealing processing may be further performed to finally form the source/drain zone. For an NMOS, aluminum ions or arsenic ions may be injected; and for a PMOS, boron ions may be injected. Certainly, it is not limited to these ions, and injection of other ions commonly used in the art may also be used to form the NMOS or the PMOS.

Subsequently, conventional steps, such as metal contact, barrier layer deposition, local interconnection, and interlayer medium layer forming may be further performed to finally form a complete semiconductor device. All these steps use conventional operations of a semiconductor manufacturing technology, and details are not described herein again.

In addition, S506 to S512 in this embodiment of the present invention may be combined with S301 to S309 in the foregoing Embodiment 2 to obtain another solution, and details are not described herein again.

It should be noted that the foregoing embodiment describes in detail the solution of combining the semiconductor fin fabrication method in this embodiment of the present invention and a gate-first technology; and in addition, the semiconductor fin fabrication method in this embodiment of the present invention may also be combined with a gate-last technology, which is to be described in detail in the subsequent embodiment.

Embodiment 4

FIG. 7 is a schematic flowchart of a Fin FET device fabrication method according to this embodiment of the present invention, where the Fin FET device uses a semiconductor fin fabricated by using the fabrication method in the foregoing embodiments. FIG. 8*a* (1) to FIG. 8*h* (3) are schematic structural diagrams at all stages of a process of fabricating the Fin FET device, where FIG. (1) is a top view, FIG. (2) is a sectional view of FIG. (1) in an AA' direction, and FIG. (3) is a sectional view of FIG. (1) in a BB' direction. With reference to FIG. 7 to FIG. 8*h* (3), a procedure of the Fin FET device fabrication method is as follows:

It should be noted that the semiconductor fin fabrication procedure is the same as the procedure S101 to S105 or S301 to S309 in the foregoing embodiments, and details are not described herein again. Herein, emphasis is imposed only on a procedure of fabricating a Fin FET device on a substrate on which a semiconductor fin is formed.

S701: Form a first oxidized layer 18 in a zone, except a fin 14, on a substrate 11, as shown in FIG. 8*a* (1), FIG. 8*a* (2), and FIG. 8*a* (3).

The first oxidized layer 18 is formed in the zone, except the fin 14, on the substrate 11 in a manner of dry oxidation, thermal oxidation, or the like. The first oxidized layer 18 may be used as a gate oxidized layer of a semiconductor device to isolate, from the substrate, a gate that is to be fabricated subsequently.

S702: Oxidize a part of the fin 14 to form a second oxidized layer 19, where the second oxidized layer 19 is located between the substrate 11 and the fin 14, and a height of the second oxidized layer 19 is the same as a height of the first oxidized layer 19, as shown in FIG. 8*b* (1), FIG. 8*b* (2), and FIG. 8*b* (3).

The second oxidized layer 19 is fabricated between the fin 14 and the substrate 11 to isolate the fin from the substrate in the semiconductor device. The second oxidized layer 19 may be fabricated by using a dry oxidation method, a thermal oxidation method, or the like, so that the second oxidized layer 19 comes into contact with the first oxidized layer 18.

S703: Form a pseudo gate layer 21' on a top of the fin 14, as shown in FIG. 8*c* (1), FIG. 8*c* (2), and FIG. 8*c* (3).

The pseudo gate layer 21' uses silicon nitride. The pseudo gate layer 21' is deposited on or epitaxially grown on the top of the fin 14 and a surface of the first oxidized layer 18.

In another embodiment of the present invention, before S703 is performed, lateral walls may also be first fabricated on two sides of the fin 14. The fabrication process is the same as S509 in the foregoing embodiment, and details are not described herein again.

S704: Remove an excess pseudo gate layer 21' by means of etching, to form a pseudo gate strip 21" intersecting with the fin 14, as shown in FIG. 8*d* (1), FIG. 8*d* (2), and FIG. 8*d* (3).

The excess pseudo gate layer is removed by means of anisotropic etching, and a location of the formed pseudo gate strip 21" is the same as that of a gate strip that is to be fabricated subsequently.

S705: Form side walls 22 on two sides of the pseudo gate strip 21", as shown in FIG. 8*e* (1), FIG. 8*e* (2), and FIG. 8*e* (3).

An epitaxial layer is first formed on a top of the pseudo gate strip 21", and tops and surfaces of other structures (including the fin and the first oxidized layer), for example, by using a CVD technology or an epitaxial growth technology, and the epitaxial layer uses, for example, silicon nitride. Then, the epitaxial layer is back-etched to form the side walls 22 on the two sides of the pseudo gate strip 21".

S706: Perform ion injection by using the side walls 22 as masks, to form a source/drain zone 23 within the substrate 11, as shown in FIG. 8*f* (1), FIG. 8*f* (2), and FIG. 8*f* (3).

Preferably, after the ion injection is completed, quick annealing processing may be further performed to finally form the source/drain zone. For an NMOS, aluminum ions or arsenic ions may be injected; and for a PMOS, boron ions may be injected. Certainly, it is not limited to these ions, and injection of other ions commonly used in the art may also be used to form the NMOS or the PMOS.

S707: Remove the pseudo gate strip 21", as shown in FIG. 8*g* (1), FIG. 8*g* (2), and FIG. 8*g* (3).

The pseudo gate strip 21" may be removed by using an etching technology, and preferably, by means of anisotropic etching.

S708: Form a gate strip 21 on the fin 14 between the side walls 22, as shown in FIG. 8*h* (1), FIG. 8*h* (2), and FIG. 8*h* (3).

The gate strip 21 is formed on the gate oxidized layer between the side walls 22 by using a selective epitaxial growth technology. The gate strip 21 uses a polycrystalline silicon material or a metallic material. If the gate strip uses a polycrystalline silicon material, the gate strip may be fabricated in a manner of epitaxial growth, deposition, or the like; or if the gate strip uses a metallic material, the gate strip may be fabricated by using a PVD method, for example, magnetron sputtering.

Subsequently, conventional steps, such as metal contact, barrier layer deposition, local interconnection, and interlayer medium layer forming may be further performed to finally form a complete semiconductor device. All these steps use conventional operations of a semiconductor manufacturing technology, and details are not described herein again.

In addition, in this embodiment of the present invention, the Fin FET device using the fin in embodiments of the present invention may also use an SOI substrate or another type of substrate, and details are not described herein again.

Embodiment 5

FIG. 9 is a flowchart of a Fin FET device fabrication method according to this embodiment of the present invention, where the Fin FET device uses a semiconductor fin fabricated by using the fabrication method in the foregoing embodiment. FIG. 10a (1) to FIG. 10h (3) are schematic structural diagrams at all stages of a process of fabricating the Fin FET device, where FIG. (1) is a top view, FIG. (2) is a sectional view of FIG. (1) in an AA' direction, and FIG. (3) is a sectional view of FIG. (1) in a BB' direction. With reference to FIG. 9 to FIG. 10h (3), the flowchart of the Fin FET device fabrication method is as follows:

It should be noted that the semiconductor fin fabrication procedure is the same as the procedure S101 to S105 or S301 to S309 in the foregoing embodiments, and details are not described herein again. Herein, emphasis is imposed only on a procedure of fabricating a Fin FET device on a substrate on which a semiconductor fin is formed.

S901: Form a first oxidized layer 18 in a zone, except a fin 14, on a substrate 11, as shown in FIG. 10a (1), FIG. 10a (2), and FIG. 10a (3).

The first oxidized layer 18 is formed in the zone, except the fin 14, on the substrate 11 in a manner of dry oxidation, thermal oxidation, or the like. The first oxidized layer 18 may be used as a gate oxidized layer of a semiconductor device to isolate, from the substrate, a gate that is to be fabricated subsequently.

S902: Oxidize a part of the fin 14 to form a second oxidized layer 19, where the second oxidized layer 24 is located between the substrate 11 and the fin 14, and a height of the second oxidized layer 19 is the same as a height of the first oxidized layer 19, as shown in FIG. 10b (1), FIG. 10b (2), and FIG. 10b (3).

The second oxidized layer 19 is fabricated between the fin 14 and the substrate 11 to isolate the fin from the substrate in the semiconductor device. The second oxidized layer 19 may be fabricated by using a dry oxidation method, a thermal oxidation method, or the like, so that the second oxidized layer 19 comes into contact with the first oxidized layer 18.

S903: Fabricate a gate electrode layer 24 on a top of the fin 14 and a surface of the first oxidized layer 19, as shown in FIG. 10c (1), FIG. 10c (2), and FIG. 10c (3).

The gate electrode layer 24 may use polycrystalline silicon or metal. If polycrystalline silicon is used, the gate electrode layer 24 may be fabricated in a manner of epitaxial growth, deposition, or the like; or if metal is used, the gate electrode layer 24 may be fabricated by using a PVD method, for example, magnetron sputtering.

S904: Selectively epitaxially grow a protective layer 25 in a predetermined zone on a surface of the gate electrode layer 24, where the gate electrode layer 24 under the predetermined zone intersects with the fin 14, as shown in FIG. 10d (1), FIG. 10d (2), and FIG. 10d (3).

The protective layer uses silicon oxide or silicon oxynitride. The protective layer 25 can be fabricated in some zones in a selective epitaxial growth manner, and the protective layer 25 is not fabricated in other zones. The predetermined zone on the surface of the gate electrode layer 24 is a zone in which a gate strip needs to be fabricated in a subsequent step.

S905: Remove the gate electrode layer 24 by means of anisotropic etching and by using the protective layer 25 as a mask, and expose the fin 14, as shown in FIG. 10e (1), FIG. 10e (2), and FIG. 10e (3).

S906: Remove the protective layer 25 by means of anisotropic etching, to expose the gate strip 21, as shown in FIG. 10f (1), FIG. 10f (2), and FIG. 10f (3).

After the protective layer 25 is removed, the gate strip 21 under a protective layer 25 is left, where the gate strip 21 intersects with the fin 14. Preferably, the gate strip 21 is orthogonal to the fin 14.

S907: Form side walls 22 on two sides of the gate strip 21, as shown in FIG. 10g (1), FIG. 10g (2), and FIG. 10g (3).

An epitaxial layer is first formed on a top of the gate strip 21, and tops and surfaces of other structures (including the first oxidized layer and the fin), for example, by using a CVD technology or an epitaxial growth technology, and the epitaxial layer is, for example, silicon nitride. Then, the epitaxial layer is back-etched to form flank walls 15 on the two sides of the gate strip 21.

S908: Perform ion injection to form a source/drain zone 23 within the semiconductor substrate, as shown in FIG. 10h (1), FIG. 10h (2), and FIG. 10h (3).

The side walls 22 on the two sides of the gate strip 21 are used as masks, and ions are injected into the semiconductor substrate along outer sides of the side walls 22 to form a source/drain zone. Preferably, after the ion injection is completed, quick annealing processing may be further performed to finally form the source/drain zone. For an NMOS, aluminum ions or arsenic ions may be injected; and for a PMOS, boron ions may be injected.

By using the Fin FET device fabrication method in this embodiment of the present invention, a Fin FET device in which a gate strip aligns with a center of a semiconductor fin can be obtained.

Embodiment 6

FIG. 11 is a flowchart of a Fin FET device fabrication method according to this embodiment of the present invention, where the Fin FET device uses a semiconductor fin fabricated by using the fabrication method in the foregoing embodiment. FIG. 12a (1) to FIG. 12h (3) are schematic structural diagrams at all stages of a process of fabricating the Fin FET device, where FIG. 1) is a top view, FIG. (2) is a sectional view of FIG. (1) in an AA' direction, and FIG. (3) is a sectional view of FIG. (1) in a BB' direction. With reference to FIG. 11 to FIG. 12h (3), a procedure of fabricating the Fin FET device is as follows:

It should be noted that the semiconductor fin fabrication procedure is the same as the procedure S101 to S105 or S301 to S309 in the foregoing embodiments, and details are not described herein again. Herein, emphasis is imposed only on a procedure of fabricating a Fin FET device on a substrate on which a semiconductor fin is formed.

S1101: Form a first oxidized layer 18 in a zone, except a fin 14, on a substrate 11, as shown in FIG. 12a (1), FIG. 12a (2), and FIG. 12a (3).

The first oxidized layer 18 is formed in the zone, except the fin 14, on the substrate 11 in a manner of dry oxidation, thermal oxidation, or the like. The first oxidized layer 18 may be used as a gate oxidized layer of a semiconductor device to isolate, from the substrate, a gate that is to be fabricated subsequently.

S1102: Oxidize a part of the fin 14 to form a second oxidized layer 19, where the second oxidized layer 19 is located between the substrate 11 and the fin 14, and a height of the second oxidized layer 19 is the same as a height of the first oxidized layer 19, as shown in FIG. 12*b* (1), FIG. 12*b* (2), and FIG. 12*b* (3).

The second oxidized layer 19 is fabricated between the fin 14 and the substrate 11 to isolate the fin from the substrate in the semiconductor device. The second oxidized layer 19 may be fabricated by using a dry oxidation method, a thermal oxidation method, or the like, so that the second oxidized layer 19 comes into contact with the first oxidized layer 18.

S1103: Grow a protective layer 25 on the substrate 11 on which the fin is formed, as shown in FIG. 12*c* (1), FIG. 12*c* (2), and FIG. 12*c* (3).

The protective layer 25 uses silicon oxide or silicon oxynitride. The protective layer 25 is fabricated by using a CVD technology or an epitaxial growth technology. The protective layer 25 covers the fin 14 and the first oxidized layer 18 on the substrate 11.

S1104: Remove the protective layer 25 in a predetermined zone, and the protective layer 25 is retained only in other zones, as shown in FIG. 12*d* (1), FIG. 12*d* (2), and FIG. 12*d* (3).

The protective layer 25 in the predetermined zone is removed by using an etching technology, and preferably, the protective layer in the predetermined zone is selectively removed by using an anisotropic etching technology, where the predetermined zone is a zone in which a subsequent gate strip is located.

S1105: Fabricate a gate electrode layer 24 in the predetermined zone, as shown in FIG. 12*e* (1), FIG. 12*e* (2), and FIG. 12*e* (3).

The gate electrode layer 24 may use polycrystalline silicon or metal. If polycrystalline silicon is used, the gate electrode layer 24 may be fabricated in a manner of epitaxial growth, deposition, or the like; or if metal is used, the gate electrode layer 24 may be fabricated by using a PVD method, for example, magnetron sputtering.

S1106: Remove the remaining protective layer 25 to expose the fin 14, as shown in FIG. 12*f* (1), FIG. 12*f* (2), and FIG. 12*f* (3).

The remaining protective layer is removed by means of anisotropic etching.

S1107: Form side walls 22 on two sides of a gate strip 21, as shown in FIG. 12*g* (1), FIG. 12*g* (2), and FIG. 12*g* (3).

An epitaxial layer is first formed on a top of the gate strip 21, and tops and surfaces of other structures (including the gate oxidized layer and the fin), for example, by using a CVD technology or an epitaxial growth technology, and the epitaxial layer is, for example, silicon nitride. Then, the epitaxial layer is back-etched to form flank walls 15 on the two sides of the gate strip 21.

S1108: Perform ion injection to form a source/drain zone 23 within the semiconductor substrate, as shown in FIG. 12*h* (1), FIG. 12*h* (2), and FIG. 12*h* (3).

The side walls 22 on the two sides of the gate strip 21 are used as masks, and ions are injected into the semiconductor substrate along outer sides of the side walls 22 to form a source/drain zone. Preferably, after the ion injection is completed, quick annealing processing may be further performed to finally form the source/drain zone. For an NMOS, aluminum ions or arsenic ions may be injected; and for a PMOS, boron ions may be injected.

The foregoing descriptions are merely exemplary implementation manners of the present invention. It should be noted that a person of ordinary skill in the art may make several improvements or polishing without departing from the principle of the present invention and the improvements or polishing shall fall within the protection scope of the present invention.

What is claimed is:
1. A semiconductor fin fabrication method, comprising:
   providing a substrate;
   selectively epitaxially growing a first mask layer in a predetermined zone on the substrate, wherein selectively epitaxially growing the first mask layer further comprises selectively epitaxially growing the first mask layer using chlorine-containing silicon source gas at a temperature between 750° C. to 900° C.;
   selectively epitaxially growing a first epitaxial layer on the substrate by using the first mask layer as a mask; and
   removing the first mask layer and a part, under the first mask layer, of the substrate by using the first epitaxial layer as a mask and by using an anisotropic etching method, so as to form a fin under the first epitaxial layer.

2. The fabrication method according to claim 1, further comprising:
   removing the first epitaxial layer by means of etching.

3. The fabrication method according to claim 1, further comprising:
   performing rounding processing on a top of the fin by using a high-temperature oxidation method.

4. The fabrication method according to claim 1, further comprising:
   forming flank walls on two sides of the fin;
   forming second mask layers on outer sides of the flank walls;
   selectively epitaxially growing new fins on outer sides of the second mask layers; and
   removing the fin, the flank walls, and the second mask layers by means of anisotropic etching, to expose the new fins.

5. The fabrication method according to claim 4, wherein spacings between two adjacent new fins are equal.

6. The fabrication method according to claim 1, further comprising:
   forming a first oxidized layer in a zone, except the fin, on the substrate; and
   oxidizing a part of the fin to form a second oxidized layer, wherein the second oxidized layer comes into contact with the substrate, and a height of the second oxidized layer is the same as a height of the first oxidized layer.

7. A Fin field-effect transistor (FET) device fabrication method, comprising:
   providing a substrate;
   selectively epitaxially growing a first mask layer in a predetermined zone on the substrate, wherein selectively epitaxially growing the first mask layer further comprises selectively epitaxially growing the first mask layer using chlorine-containing silicon source gas at a temperature between 750° C. to 900° C.;
   selectively epitaxially growing a first epitaxial layer on the substrate by using the first mask layer as a mask;
   removing the first mask layer and a part, under the first mask layer, of the substrate by using the first epitaxial layer as a mask and by using an anisotropic etching method, so as to form a fin under the first epitaxial layer;
forming a first oxidized layer in a zone, except the fin, on the substrate;
oxidizing a part of the fin to form a second oxidized layer, wherein the second oxidized layer comes into contact with the substrate, and a height of the second oxidized layer is the same as a height of the first oxidized layer;
performing rounding processing on top corners of the fin by using a high-temperature oxidation method;
forming lateral walls on two sides of the fin;
forming a gate strip intersecting with the fin;
forming side walls on two sides of the gate strip; and
performing ion injection by using the side walls as masks, to form a source/drain zone within the substrate.

8. The fabrication method according to claim 7, wherein forming a gate strip intersecting with the fin comprises:
forming an epitaxial layer on a top of the fin, tops of the lateral walls, and a surface of the first oxidized layer;
removing an excess epitaxial layer by means of etching, to form the gate strip intersecting with the fin; or
forming a protective layer, along a length direction of the fin, from two sides to the middle of the substrate by using a selective epitaxial growth technology until a trench is formed in a middle location along the length direction of the fin;
forming the gate strip within the trench by means of deposition; and
removing the protective layer by means of etching, to expose the fin.

9. A Fin field-effect transistor (FET) device fabrication method, comprising:
providing a substrate;
selectively epitaxially growing a first mask layer in a predetermined zone on the substrate, wherein selectively epitaxially growing the first mask layer further comprises selectively epitaxially growing the first mask layer using chlorine-containing silicon source gas at a temperature between 750° C. to 900° C.;
selectively epitaxially growing a first epitaxial layer on the substrate by using the first mask layer as a mask;
removing the first mask layer and a part, under the first mask layer, of the substrate by using the first epitaxial layer as a mask and by using an anisotropic etching method, so as to form a fin under the first epitaxial layer;
forming a first oxidized layer in a zone, except the fin, on the substrate;
oxidizing a part of the fin to form a second oxidized layer, wherein the second oxidized layer comes into contact with the substrate, and a height of the second oxidized layer is the same as a height of the first oxidized layer;
depositing a pseudo gate layer on a top of the fin and a surface of the first oxidized layer;
removing an excess pseudo gate layer by means of etching, to form a pseudo gate strip intersecting with the fin;
forming side walls on two sides of the pseudo gate strip;
performing ion injection by using the side walls as masks, to form a source/drain zone within the substrate;
removing the pseudo gate strip; and
forming a gate strip on a gate oxidized layer between the side walls.

10. A Fin FET device fabrication method, comprising:
providing a substrate;
selectively epitaxially growing a first mask layer in a predetermined zone on the substrate, wherein selectively epitaxially growing the first mask layer further comprises selectively epitaxially growing the first mask layer using chlorine-containing silicon source gas at a temperature between 750° C. to 900° C.;
selectively epitaxially growing a first epitaxial layer on the substrate by using the first mask layer as a mask;
removing the first mask layer and a part, under the first mask layer, of the substrate by using the first epitaxial layer as a mask and by using an anisotropic etching method, so as to form a fin under the first epitaxial layer;
forming a first oxidized layer in a zone, except the fin, on the substrate;
oxidizing a part of the fin to form a second oxidized layer, wherein the second oxidized layer comes into contact with the substrate, and a height of the second oxidized layer is the same as a height of the first oxidized layer;
fabricating a gate electrode layer on a top of the fin and a surface of the first oxidized layer;
selectively epitaxially growing a protective layer in a predetermined zone on a surface of the gate electrode layer, wherein the gate electrode layer under the predetermined zone intersects with the fin;
removing the gate electrode layer by means of anisotropic etching and by using the protective layer as a mask, to expose the fin;
removing the protective layer by means of anisotropic etching;
forming side walls on two sides of the gate strip; and
performing ion injection by using the side walls as masks, to form a source/drain zone within the substrate.

11. A Fin FET device fabrication method, comprising:
providing a substrate;
selectively epitaxially growing a first mask layer in a predetermined zone on the substrate, wherein selectively epitaxially growing the first mask layer further comprises selectively epitaxially growing the first mask layer using chlorine-containing silicon source gas at a temperature between 750° C. to 900° C.;
selectively epitaxially growing a first epitaxial layer on the substrate by using the first mask layer as a mask;
removing the first mask layer and a part, under the first mask layer, of the substrate by using the first epitaxial layer as a mask and by using an anisotropic etching method, so as to form a fin under the first epitaxial layer;
forming a first oxidized layer in a zone, except the fin, on the substrate;
oxidizing a part of the fin to form a second oxidized layer, wherein the second oxidized layer comes into contact with the substrate, and a height of the second oxidized layer is the same as a height of the first oxidized layer;
depositing a protective layer on a top of the fin and a surface of the first oxidized layer;
removing the protective layer in a predetermined zone by means of anisotropic etching, wherein the predetermined zone is a zone in which a gate strip is located;
growing a gate electrode layer in the predetermined zone;
removing the protective layer on the top of the fin to expose the fin;
forming side walls on two sides of the gate strip; and
performing ion injection by using the side walls as masks, to form a source/drain zone within the substrate.

* * * * *